United States Patent
Pan

(10) Patent No.: US 11,448,954 B2
(45) Date of Patent: Sep. 20, 2022

(54) ILLUMINATION SYSTEM AND PROJECTION DEVICE

(71) Applicant: Coretronic Corporation, Hsin-Chu (TW)

(72) Inventor: Haw-Woei Pan, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 17/206,129

(22) Filed: Mar. 19, 2021

(65) Prior Publication Data

US 2021/0294200 A1   Sep. 23, 2021

(30) Foreign Application Priority Data

Mar. 20, 2020   (CN) .......................... 202010201581.0

(51) Int. Cl.
*G03B 33/08* (2006.01)
*G03B 21/20* (2006.01)

(52) U.S. Cl.
CPC ........... *G03B 33/08* (2013.01); *G03B 21/204* (2013.01); *G03B 21/2066* (2013.01)

(58) Field of Classification Search
None
See application file for complete search history.

(56) References Cited

U.S. PATENT DOCUMENTS

| | | |
|---|---|---|
| 2013/0176540 A1 | 7/2013 | Wei et al. |
| 2018/0173087 A1 | 6/2018 | Hsieh et al. |
| 2019/0041735 A1 | 2/2019 | Tanaka |

(Continued)

FOREIGN PATENT DOCUMENTS

| | | |
|---|---|---|
| CN | 102722074 | 10/2012 |
| CN | 103207507 | 7/2013 |
| CN | 103792766 | 5/2014 |

(Continued)

OTHER PUBLICATIONS

"Search Report of Europe Counterpart Application", dated Jul. 30, 2021, p. 1-p. 13.

(Continued)

*Primary Examiner* — Michelle M Iacoletti
*Assistant Examiner* — Danell L Owens
(74) *Attorney, Agent, or Firm* — JCIPRNET

(57) ABSTRACT

The invention provides an illumination system, configured to provide an illumination beam. The illumination system includes blue, green, and red laser modules respectively configured to provide blue, green, and red beams and a wavelength conversion component. The wavelength conversion component includes a wavelength conversion region and an optical output region. In a first time interval, the blue, green, and red beams are sequentially transmitted to the optical output region, where the illumination beam includes the blue, green, and red beams. In a second time interval, the blue beam is transmitted to the wavelength conversion region to form a converted beam, where the illumination beam includes the converted beam. A projection device including the illumination system is also provided. The projection device using the illumination system in the invention achieves color performance of a wide color gamut at relatively low costs.

20 Claims, 20 Drawing Sheets

(56) References Cited

U.S. PATENT DOCUMENTS

2019/0331994 A1   10/2019   Wang et al.

FOREIGN PATENT DOCUMENTS

| | | | | |
|---|---|---|---|---|
| CN | 208537894 | | 2/2019 | |
| CN | 110068982 | | 7/2019 | |
| CN | 209265161 | | 8/2019 | |
| CN | 110244505 | | 9/2019 | |
| CN | 110277040 | | 9/2019 | |
| CN | 210072303 | | 2/2020 | |
| CN | 111381420 A | * | 7/2020 | ............. G03B 21/20 |
| WO | 2019174271 | | 9/2019 | |

OTHER PUBLICATIONS

"Office Action of China Counterpart Application", dated Feb. 24, 2022, p. 1-p. 14.

* cited by examiner

ILLUMINATION SYSTEM AND PROJECTION DEVICE

CROSS-REFERENCE TO RELATED APPLICATION

This application claims the priority benefit of China application serial no. 202010201581.0, filed on Mar. 20, 2020. The entirety of the above-mentioned patent application is hereby incorporated by reference herein and made a part of this specification.

BACKGROUND OF THE INVENTION

1. Field of the Invention

The invention relates to an illumination system and a projection device.

2. Description of Related Art

With the progress of science and technology, projectors are widely applied in life, for example, indoors, cinemas, outdoors, or in other different places. However, as users have growing demands on projection devices, the image quality of the projectors is also required to be higher.

In an existing projector architecture, light in different colors is generated by an excitation light source, a phosphor wheel, and a filter wheel at different timings. However, because the architecture emits yellow light by exciting phosphor and then filters green light and red light out of the yellow light by using the filter wheel, the architecture can produce only some narrow-band green light, color gamut coverage of visible light is low, and the green light is highly consumed, which does not have good color performance and is inefficient.

In another existing projector architecture, light in different colors is generated by red, green, and blue laser diode (LD) arrays at different timings. Although color gamut coverage of visible light is high, the architecture uses a large quantity of green LDs, which is costly.

In addition, in the foregoing projector architecture, a diffusion wheel is added to a laser path to resolve a laser speckle problem, which is costly.

The information disclosed in this Background section is only for enhancement of understanding of the background of the described technology and therefore it may contain information that does not form the related art that is already known to a person of ordinary skill in the art. Further, the information disclosed in the Background section does not mean that one or more problems to be resolved by one or more embodiments of the invention were acknowledged by a person of ordinary skill in the art.

SUMMARY OF THE INVENTION

Embodiments of the invention provide an illumination system, so that a projection device using the illumination system can have good color performance.

The embodiments of the invention provide a projection device, which has good color performance.

Other objectives and advantages of the invention may be further known from technical features disclosed in the invention.

To achieve one of or some or all of the foregoing objectives or other objectives, in an embodiment of the invention, an illumination system configured to provide an illumination beam is provided, including: a blue laser module, a green laser module, a red laser module, and a wavelength conversion component. The blue laser module is configured to provide a blue beam. The green laser module is configured to provide a green beam. The red laser module is configured to provide a red beam. The wavelength conversion component includes a wavelength conversion region and an optical output region. In a first time interval, the blue beam, the green beam, and the red beam are sequentially transmitted to the optical output region, where the illumination beam includes the blue beam, the green beam, and the red beam. In a second time interval, the blue beam is transmitted to the wavelength conversion region to form a converted beam, where the illumination beam includes the converted beam.

In order to achieve one of or a part of or all of the foregoing objectives or other objectives, in an embodiment of the invention, a projection device is provided, includes the illumination system, a light valve, and a projection lens. The light valve is disposed on a transmitting path of an illumination beam, and converts the illumination beam into an image beam. The projection lens is disposed on a transmitting path of the image beam.

Based on the above, in the illumination system and the projection device in the embodiments of the invention, a comprehensive optical architecture including the blue, green, and red laser modules and the wavelength conversion component is used. Compared with the related art, because the invention includes more green light sources (the green laser module and the wavelength conversion component), a quantity of green light emitting components in the green laser module can be reduced in use, or light intensity of the green beam provided by the green laser module can be reduced, while an overall illumination beam provided by the illumination system can maintain same light intensity in a green light band. Therefore, the illumination system and the projection device can achieve color performance of a wide color gamut at relatively low costs.

Other objectives, features and advantages of the invention will be further understood from the further technological features disclosed by the embodiments of the invention where there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing", "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
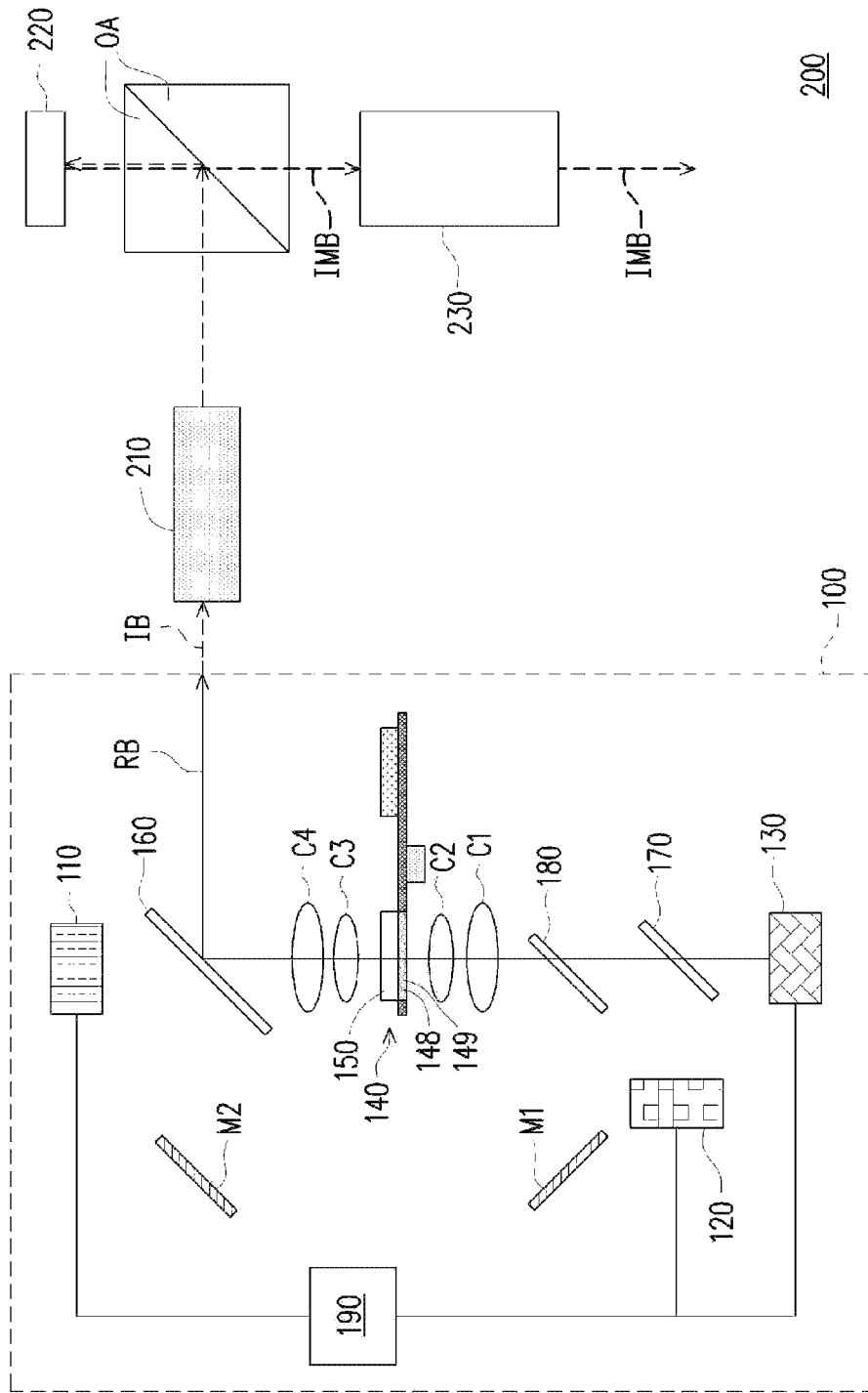
FIG. 1A to FIG. 1C are schematic diagrams of light paths of a projection device in first to third sub time intervals in a first time interval according to an embodiment of the invention.
Figure 1B:
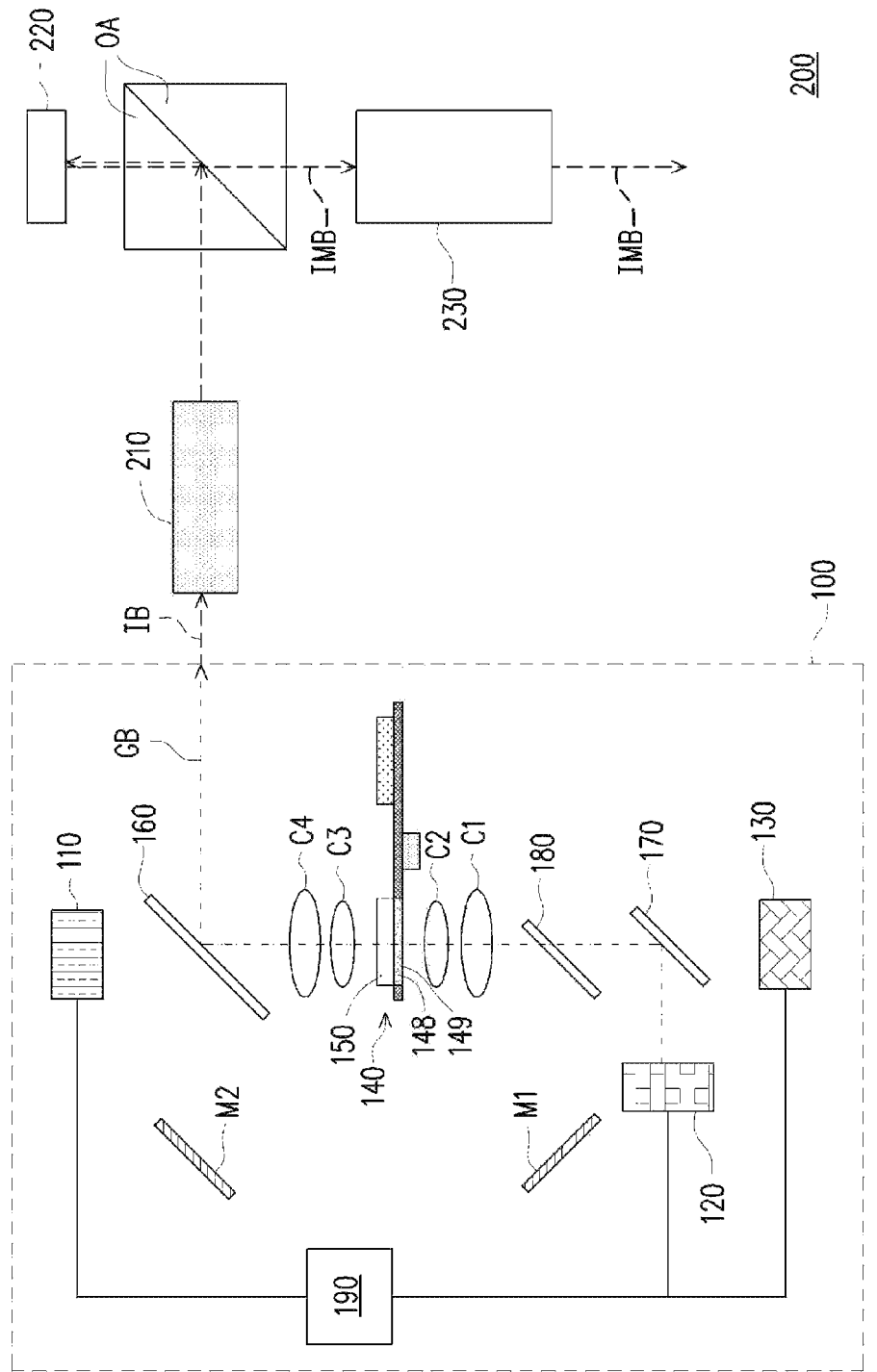
Figure 1C:
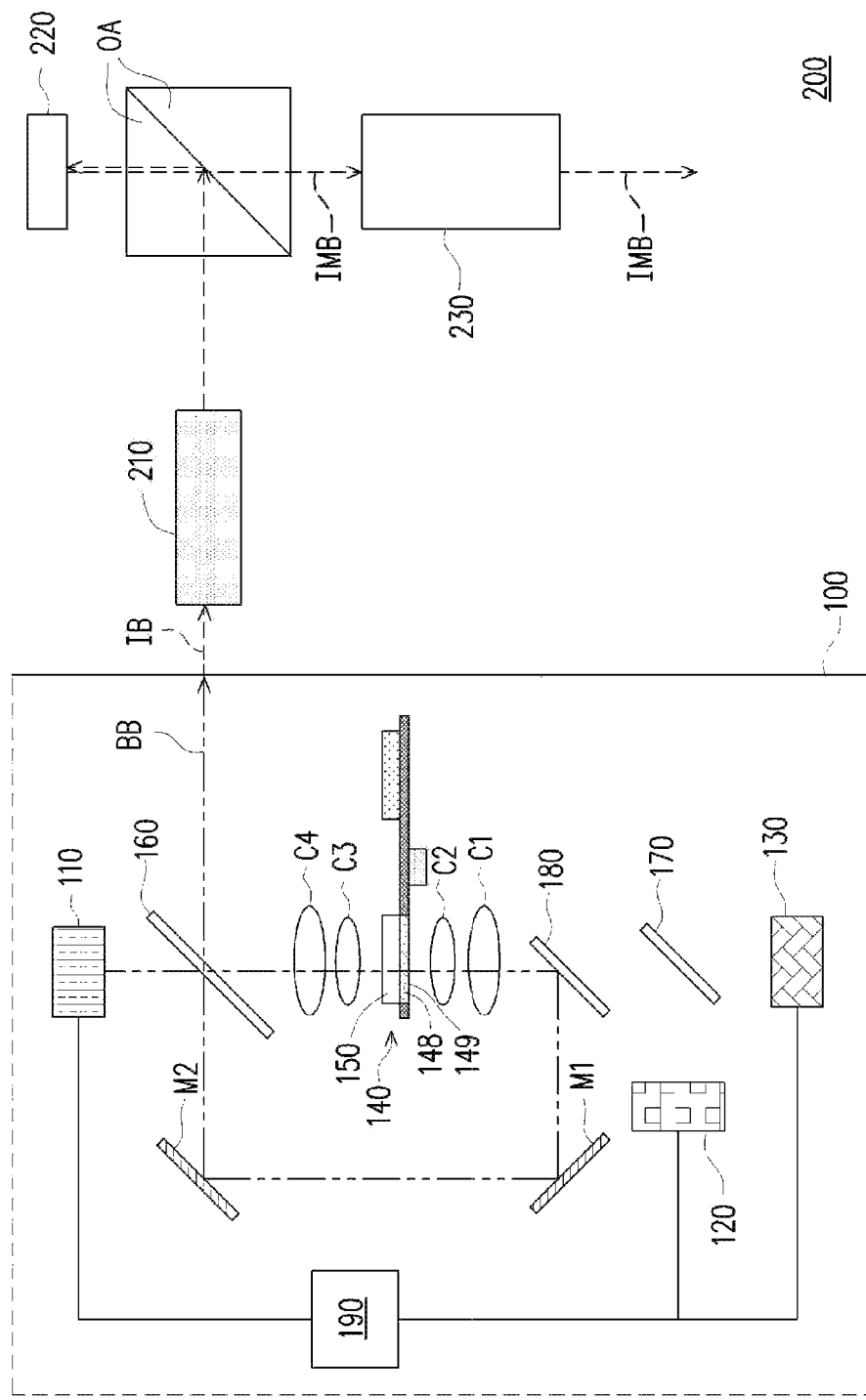
Figure 1D:
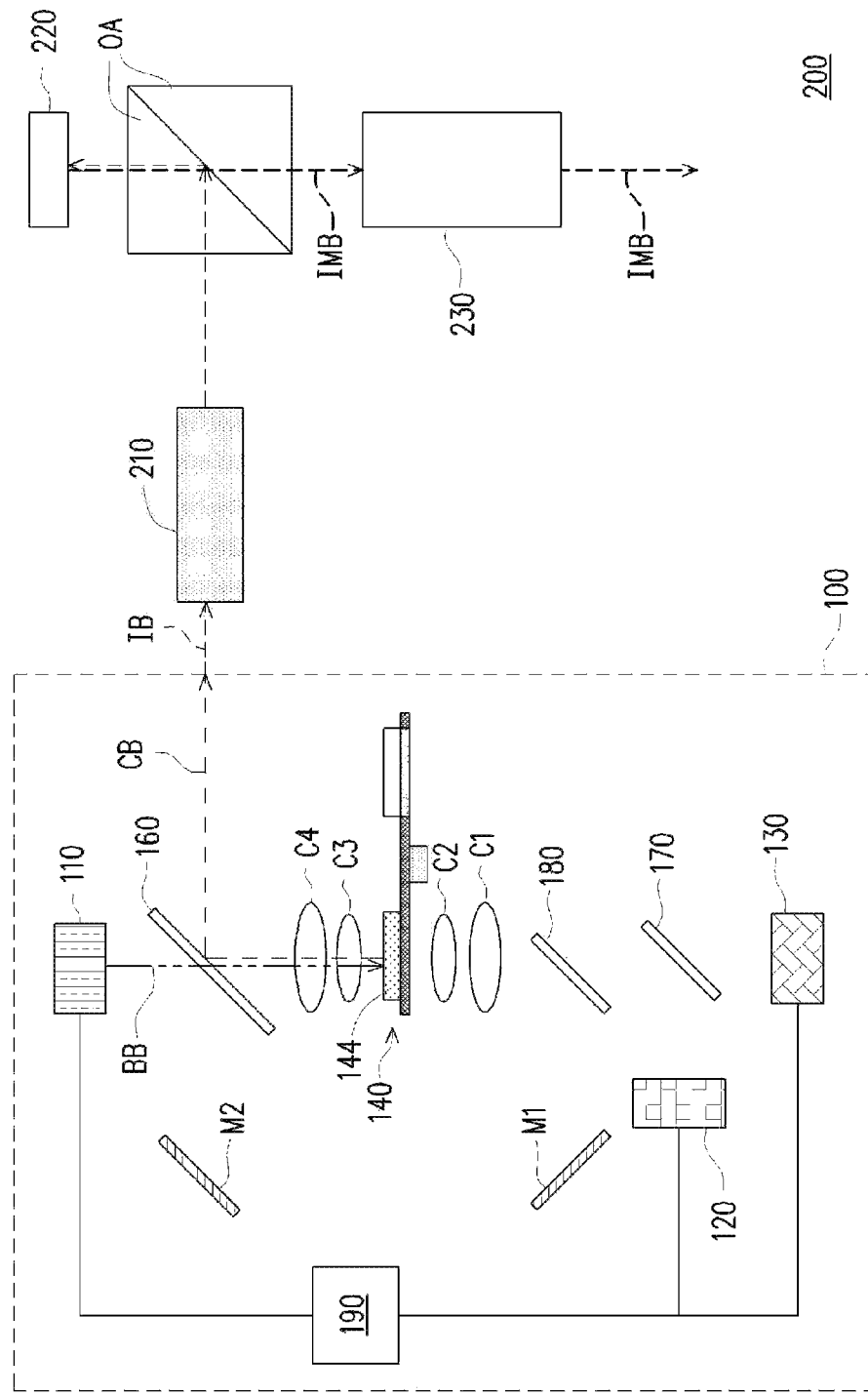
FIG. 1D is a schematic diagram of a light path of the projection device in FIG. 1A to FIG. 1C in a second time interval.
Figure 2A:
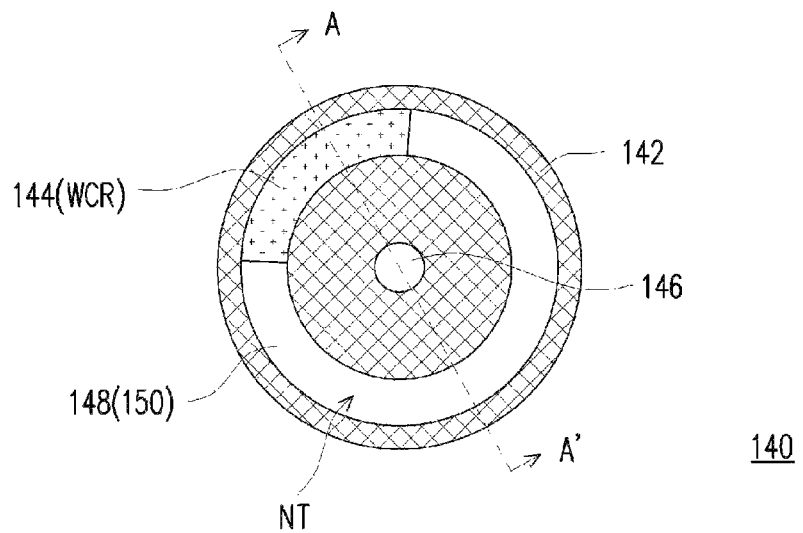
FIG. 2A is a schematic top view of a wavelength conversion component of the projection device in FIG. 1A to FIG. 1D.
Figure 2B:
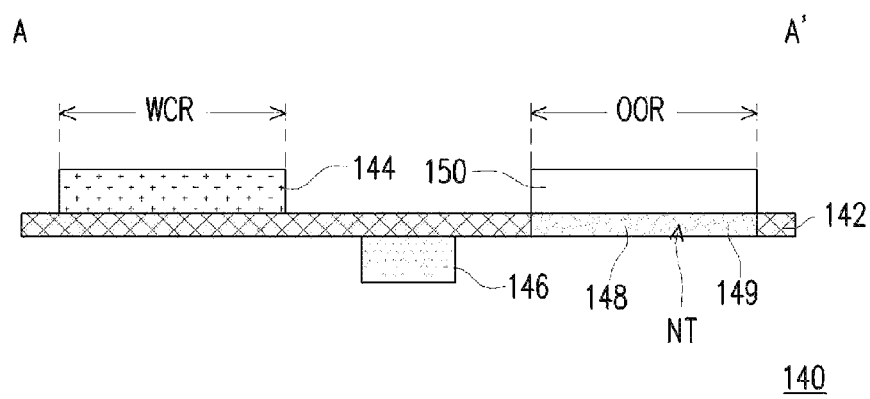
FIG. 2B is a schematic diagram of a cross section along a line A-A' in FIG. 2A.

FIG. 1A to FIG. 1C are schematic diagrams of light paths of a projection device in first to third sub time intervals in a first time interval according to an embodiment of the invention. FIG. 1D is a schematic diagram of a light path of the projection device in FIG. 1A to FIG. 1C in a second time interval. FIG. 2A is a schematic top view of a wavelength conversion component of the projection device in FIG. 1A to FIG. 1D. FIG. 2B is a schematic diagram of a cross section along a line A-A' in FIG. 2A.

Referring to FIG. 1A to FIG. 1D, in the embodiment, a projection device 200 includes an illumination system 100, a light homogenizing component 210, a light valve 220, and a projection lens 230. The illumination system 100 is configured to provide an illumination beam IB, and includes: a blue laser module 110, a green laser module 120, a red laser module 130, a wavelength conversion component 140, a ½-wavelength delay component 150, a first light splitting component 160, a second light splitting component 170, a third light splitting component 180, and a controller 190. The components are described below in detail.

First, the components in the illumination system 100 are described.

The laser module may be an array obtained by arranging one or more laser emitting components or an optical assembly that integrates one or more laser emitting components, mirrors, or lenses, but the invention is not limited thereto. The laser emitting component is, for example, an LD. In the embodiment, the blue laser module 110 is internally provided with one or more blue laser emitting components that can emit blue light, to provide a blue beam BB. A peak wavelength of the blue beam BB is, for example, 455 nanometers (nm), but the invention is not limited thereto. The green laser module 120 is internally provided with one or more green laser emitting components that can emit green light, to provide a green beam GB. A peak wavelength of the green beam GB is, for example, 525 nm, but the invention is not limited thereto. The red laser module 130 is internally provided with one or more red laser emitting components that can emit red light, to provide a red beam RB. A peak wavelength of the red beam RB is, for example, 638 nm, but the invention is not limited thereto. The peak wavelength is defined as a wavelength corresponding to maximum light intensity in a light intensity spectrum. In addition, the blue beam BB, the green beam GB, and the red beam RB are narrow-band light. That is, a full width at half maximum (FWHM) of a light intensity spectrum of the beam is less than or equal to 25 nm.

In the embodiment, the wavelength conversion component 140 is an optical component, which mainly functions to convert a short-wavelength beam passing through the wavelength conversion component 140 into a long-wavelength beam opposite to the short-wavelength beam. Referring to FIG. 2A and FIG. 2B, a form of the wavelength conversion component 140 is, for example, a transmissive phosphor wheel. The wavelength conversion component 140 includes a rotating disk 142, a wavelength conversion material 144, a rotating shaft 146, a light transmission component 148, and an optical adjustment structure 149. The rotating disk 142 is provided with a notch NT, and coupled to the rotating shaft 146. The wavelength conversion material 144 is disposed on the rotating disk 142. The wavelength conversion material 144 is, for example, a photoluminescent material such as phosphor or quantum dots, but the invention is not limited thereto. As viewed from the top, the notch NT and the wavelength conversion material 144 together form an annular area. The light transmission component 148 is embedded in the notch NT, and is made of, for example, a material with a high light transmission coefficient, such as glass. A central angle of the wavelength conversion material 144 in the annular area is less than a central angle of the light transmission component 148 in the annular area. When the wavelength conversion material 144 is irradiated by a short-wavelength beam, photoluminescence occurs so that a long-wavelength beam is produced (wavelength conversion). An area defined by the wavelength conversion material 144 is also referred to as a wavelength conversion region WCR. In addition, an area defined by the light transmission component 148 allows a beam to be transmitted and output without wavelength conversion, which is also referred to as an optical output region OOR (or referred to as a light transmission region or a non-wavelength conversion region). The optical adjustment structure 149 is, for example, a structure that can adjust properties of a beam, and is disposed in the light transmission component 148. In the embodiment, the optical adjustment structure 149 includes, for example, a structure that can scatter a beam, but the invention is not limited thereto. Further, for example, scattering particles may be incorporated into the light transmission component 148, or a surface micro-structure may be disposed on a surface of the light transmission component 148 to form a rough surface, to scatter a beam.

The wavelength delay component (which is also referred to as a wave plate or a phase retarder) has different refractive indexes for beams in different polarization directions, so that beams in different polarization directions and entering the wavelength delay component have different propagation speeds, and a phase difference is introduced to the beams in different polarization directions. A person skilled in the art may introduce different phase differences by controlling a type and a thickness of a material, but the invention is not limited by the material or the thickness. In the embodiment, the wavelength delay component is, for example, a ½-wavelength delay component 150, and enables beams in different polarization directions and passing through the wavelength delay component to have a ½ phase difference.

The light splitting component generally refers to an optical component that has a light splitting function. In the embodiment, the light splitting component is a dichroic mirror (DM), and has wavelength selectivity, which is a color separation filter that splits light by using a wavelength/color, but the invention is not limited thereto. In the embodiment, the first light splitting component 160 is designed to be capable of reflecting yellow light, red light, and green light and allowing light in other colors to be transmitted, the second light splitting component 170 is designed to be capable of reflecting green light and allowing light in other colors to be transmitted, and the third light splitting component 180 is designed to be capable of reflecting blue light and allowing light in other colors to be transmitted.

The controller 190 is coupled to the blue laser module 110, the green laser module 120, and the red laser module 130, and configured to control the laser modules 110 to 130 to emit light or not. The controller 190 may be a computer, a micro controller unit (MCU), a central processing unit (CPU), a microprocessor, a digital signal processor (DSP), a programmable controller, an application-specific integrated circuits (ASIC), a programmable logic device (PLD), or other similar devices, but the invention is not limited thereto.

Next, other components in the projection device 200 are described.

The light homogenizing component 210 refers to an optical component that can uniformize a beam passing through the light homogenizing component 210. In the embodiment, the light homogenizing component 210 is, for example, an integration rod, a lens array, or other optical components that has a light homogenizing effect, but the invention is not limited thereto.

The light valve 220 is any one of spatial light modulators such as a digital micro-mirror device (DMD), a liquid-crystal-on-silicon panel (LCOS panel), or a liquid crystal panel (LCD), but the invention is not limited thereto. In the embodiment, the light valve 220 is a DMD.

The projection lens 230 is, for example, a combination of one or more dioptric optical lenses. The optical lenses include, for example, different combinations of non-planar lenses such as a double concave lens, a double convex lens, a convex lens, a convex lens, a flat convex lens, and a flat concave lens. A form and a type of the projection lens 230 is not limited in the invention.

In addition, in the embodiment, one or more mirrors M1 and M2 and lenses C1 to C4 may be optionally added into the illumination system 100, to adjust a light path. Moreover, an optical prism array OA may be optionally added into the projection device 200, to adjust a light path.

Configuration relationships between the components are described below in detail.

Referring to FIG. 1A to FIG. 1D, in the embodiment, the blue laser module 110 is disposed on one side of the wavelength conversion component 140, and the green laser module 120 and the red laser module 130 are disposed on the other side of the wavelength conversion component 140. The blue laser module 110 is disposed opposite to the red laser module 130. The green laser module 120 is disposed on one side of the blue laser module 110 and the red laser module 130. The wavelength conversion component 140 is configured on transmitting paths of the blue beam BB, the green beam GB, and the red beam RB. The first light splitting component 160, the second light splitting component 170, and the third light splitting component 180 are configured to guide beams in the illumination system 100. The first light splitting component 160 is disposed between the blue laser module 120 and the wavelength conversion component 140, and configured to guide the blue beam BB so that the blue beam BB is transmitted to the wavelength conversion component 140. The second light splitting component 170 is disposed between the green laser module 120 and the red laser module 130, and configured to guide the green beam GB and the red beam RB so that the green beam GB and the red beam RB are transmitted to the wavelength conversion component 140. The third light splitting component 180 is disposed between the wavelength conversion component 140, the third green laser module 120, and the red laser module 130, and configured to guide the green beam GB and the red beam RB so that the green beam GB and the red beam RB are transmitted to the wavelength conversion component 140. Further, the second light splitting component 170 and the third light splitting component 180 are disposed in an area between the green laser module 120, the red laser module 130, and the wavelength conversion component 140. More specifically, the second light splitting component 170 is disposed in an area between the third light splitting component 180, the green laser module 120, and the red laser module 130, and the third light splitting component 180 is disposed in an area between the wavelength conversion component 140 and the second light splitting component 170. Referring to FIG. 2A and FIG. 2B, the ½-wavelength delay component 150 is disposed on a surface of the light transmission component 148, that is, correspondingly disposed in the optical output region OOR.

Figure 3:
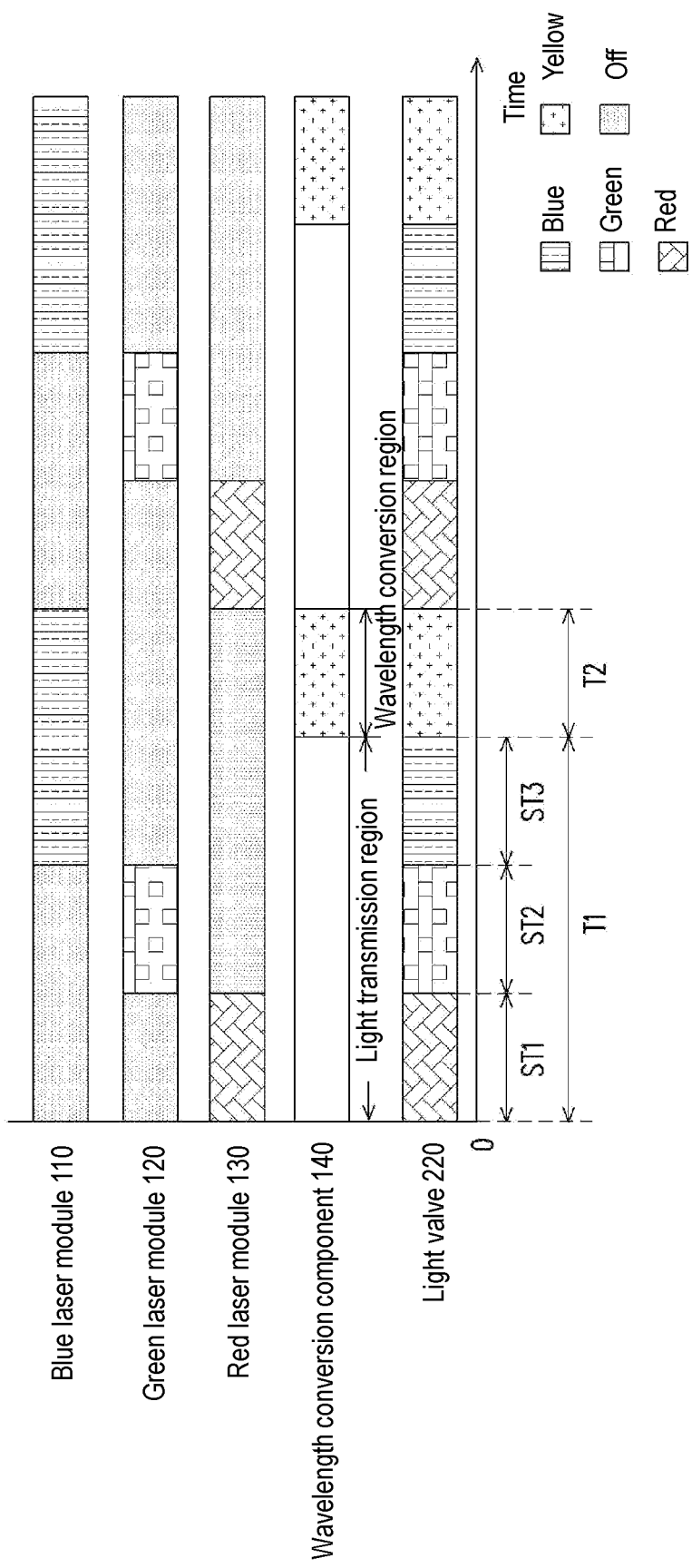
FIG. 3 is a timing diagram of different components in a projection device according to a plurality of embodiments of the invention.

FIG. 3 is a timing diagram of different components in a projection device according to a plurality of embodiments of the invention. A unit of a horizontal axis in FIG. 3 is time.

Referring to FIG. 1A to FIG. 1C and FIG. 3, in a first time interval T1, the illumination system 100 sequentially emits the red beam RB, the green beam GB, and the blue beam BB. The first time interval T1 is further divided into first to third sub time intervals ST1 to ST3 according to the output light in different colors. The illumination system 100 respectively emits the red beam RB, the green beam GB, and the blue beam BB in the first, second, and third sub time intervals ST1 to ST3. An optical effect of the illumination system 100 in the embodiment is described below in detail with reference to FIG. 1A to FIG. 1D and FIG. 3.

First, referring to FIG. 1A, FIG. 2A, and FIG. 3, in the first sub time interval ST1, the blue laser module 110 and the green laser module 120 are controlled by the controller 190 to be off, and the red laser module 130 is controlled by the controller 190 to emit the red beam RB. In this case, the rotating shaft 146 of the wavelength conversion component 140 rotates to put the light transmission component 148 on the light path of the red beam RB. After the red beam RB is emitted, the red beam RB is sequentially transmitted through the second light splitting component 170, the third light splitting component 180, the lenses C1 and C2, the light transmission component 148 (scattered by the optical adjustment structure 149 in the light transmission component 148), the ½-wavelength delay component 150, and the lenses C3 and C4, and reflected by the first light splitting component 160 to be emitted from the illumination system 100. The illumination beam IB emitted by the illumination system 100 in the first sub time interval ST1 includes the red beam RB.

Referring to FIG. 1B, FIG. 2A, and FIG. 3, in the second sub time interval ST2, the blue laser module 110 and the red laser module 130 are controlled by the controller 190 to be off, and the green laser module 120 is controlled by the controller 190 to emit the green beam GB. In this case, the rotating shaft 146 of the wavelength conversion component 140 rotates to put the light transmission component 148 on the light path of the green beam GB. After the green beam GB is emitted, the green beam GB is reflected by the second light splitting component 170 to the third light splitting component 180, then sequentially transmitted through the third light splitting component 180, the lenses C1 and C2, the light transmission component 148 (scattered by the optical adjustment structure 149 in the light transmission component 148), the ½-wavelength delay component 150, and the lenses C3 and C4, and reflected by the first light splitting component 160 to be emitted from the illumination system 100. The illumination beam IB emitted by the illumination system 100 in the second sub time interval ST2 includes the green beam GB.

Referring to FIG. 1C, FIG. 2A, and FIG. 3, in the third sub time interval ST3, the green laser module 120 and the red laser module 130 are controlled by the controller 190 to be off, and the blue laser module 110 is controlled by the controller 190 to emit the blue beam BB. In this case, the rotating shaft 146 of the wavelength conversion component 140 rotates to put the light transmission component 148 on the light path of the blue beam BB. After the blue beam BB is emitted, the blue beam BB enters in an incident direction and is transmitted through the first light splitting component 160, then sequentially transmitted through the lenses C4 and C3, the ½-wavelength delay component 150, the light transmission component 148 (scattered by the optical adjustment structure 149 in the light transmission component 148), and the lenses C2 and C1, reflected by the third light splitting component 180 to the mirror M1, then sequentially reflected by the mirrors M1 and M2 and transmitted to the first light splitting component 160 in a direction different from the incident direction, and transmitted through the first light splitting component 160 to be emitted from the illumination system 100. The illumination beam IB emitted by the illumination system 100 in the third sub time interval ST3 includes the blue beam BB.

Referring to FIG. 1D, FIG. 2A, and FIG. 3, in the second time interval T2, the green laser module 120 and the red laser module 130 are controlled by the controller 190 to be off, and the blue laser module 110 is controlled by the controller 190 to emit the blue beam BB. In this case, the rotating shaft 146 of the wavelength conversion component 140 rotates to put the wavelength conversion material 144 on the light path of the blue beam BB. After the blue beam BB is emitted, the blue beam BB is sequentially transmitted through the first light splitting component 160 and the lenses C3 and C4 to the wavelength conversion material 144. As irradiated by the blue beam BB, the wavelength conversion material 144 emits a converted beam CB. The converted beam CB is, for example, a yellow beam. The converted beam CB is transmitted to the first light splitting component 160 and then reflected by the first light splitting component 160, to be emitted from the illumination system 100. The illumination beam IB emitted by the illumination system 100 in the second time interval T2 includes the converted beam CB.

Referring to FIG. 1A to FIG. 1D again, after being emitted from the illumination system 100, the illumination beam IB is transmitted to the light homogenizing component 210, uniformized by the light component 210, and then guided by the optical prism array OA to the light valve 220. That is, the light valve 220 is disposed on a transmitting path of the illumination beam IB. Referring to FIG. 3, the light valve 220 converts illumination beams IB in different colors into image beams IMB in different colors in different time intervals. More specifically, in the first, second, and third sub time interval ST1 to ST3 and the second time interval T2, the light valve 220 is respectively controlled by red light, green light, blue light, and yellow light image control signal to convert the illumination beams IB into red, green, blue, and yellow image beams IMB. The image beam IMB is then transmitted through the optical prism array OA to the projection lens 230. That is, the projection lens 230 is disposed on a transmitting path of the image beam IMB. The projection lens 230 then transfers the image beam IMB to a projection medium (which is, for example, a projection screen or a wall).

Referring to FIG. 1A to FIG. 1C and FIG. 2A and FIG. 2B again, because the blue, red, and green beams BB, RB, and GB all pass through the optical output region OOR defined by the light transmission component 148, and the optical output region OOR is provided with the optical adjustment structure 149 (which is, for example, a scattering structure), a speckle problem can be eliminated. Moreover, because the ½-wavelength delay component 150 is correspondingly disposed in the optical output region OOR, so that phases of the blue, red, green beams BB, RB, and GB passing through the optical output region OOR may be delayed by a ½ phase difference, a problem that a picture has an abnormal color can be eliminated.

Based on the above, in the illumination system 100 and the projection device 200 in the embodiment, a comprehensive optical architecture including the wavelength conversion component 140 and the blue laser module 110, the green laser module 120, and the red laser module 130 that can respectively emit the blue beam BB, the green beam GB, and the red beam RB is used. In the first time interval T1, the blue beam BB, the green beam GB, and the red beam RB emitted by the blue laser module 110, the green laser module 120, and the red laser module 130 are sequentially transmitted to the optical output region OOR (the light transmission region and the light transmission component 148) of the wavelength conversion component 140. Illumination beams IB in the time interval T1 include the blue beam BB, the green beam GB, and the red beam RB. In the second time interval T2, the blue beam BB is transmitted to the wavelength conversion region WCR defined by the wavelength conversion material 144 of the wavelength conversion component 140, and excites the wavelength conversion material 144 to form the converted beam CB. An illumination beam IB in the time interval T2 includes the converted beam CB (which is, for example, a yellow beam, and may be used as one of green light sources). From the foregoing optical behavior, it can be learned that green light of the illumination system 100 and the projection device 200 comes from the green laser module 120 and the wavelength conversion component 140. Compared with a green light source in the related art, the illumination system 100 and the projection device 200 have more green light sources. Therefore, in the illumination system 100 and the projection device 200, a quantity of green light emitting components in the green laser module 120 can be reduced in use, or light intensity of the green beam GB provided by the green laser module 120 can be reduced, while an overall illumination beam IB provided by the illumination system 100 can maintain same light intensity in a green light band. In this way, the illumination system 100 and the projection device 200 can reach a color gamut specification of high color gamut coverage of visible light in DCI-P3 and Rec. 2020 at relatively low costs.

Moreover, because the wavelength conversion component 140 is disposed on the transmitting paths of the blue beam BB, the green beam GB, and the red beam RB, if to adjust the blue beam BB, the green beam GB, and the red beam RB, a user may integrate an optical adjustment function into, for example, the optical output region OOR of the wavelength conversion component 140 (in the foregoing embodiment, for example, scattering particles or a surface microstructure are disposed in the light transmission component 148, or the ½-wavelength delay component 150 is disposed on the light transmission component 148) instead of adding other optical adjustment/modification components to the light paths, to reduce costs.

It should be noted herein that, the following embodiments follow some content of the foregoing embodiment, the description of the same technical content is omitted, for the same reference numerals of components, reference may be made to some content of the foregoing embodiment, and the descriptions thereof are omitted in the following embodiments.

Figure 4A:
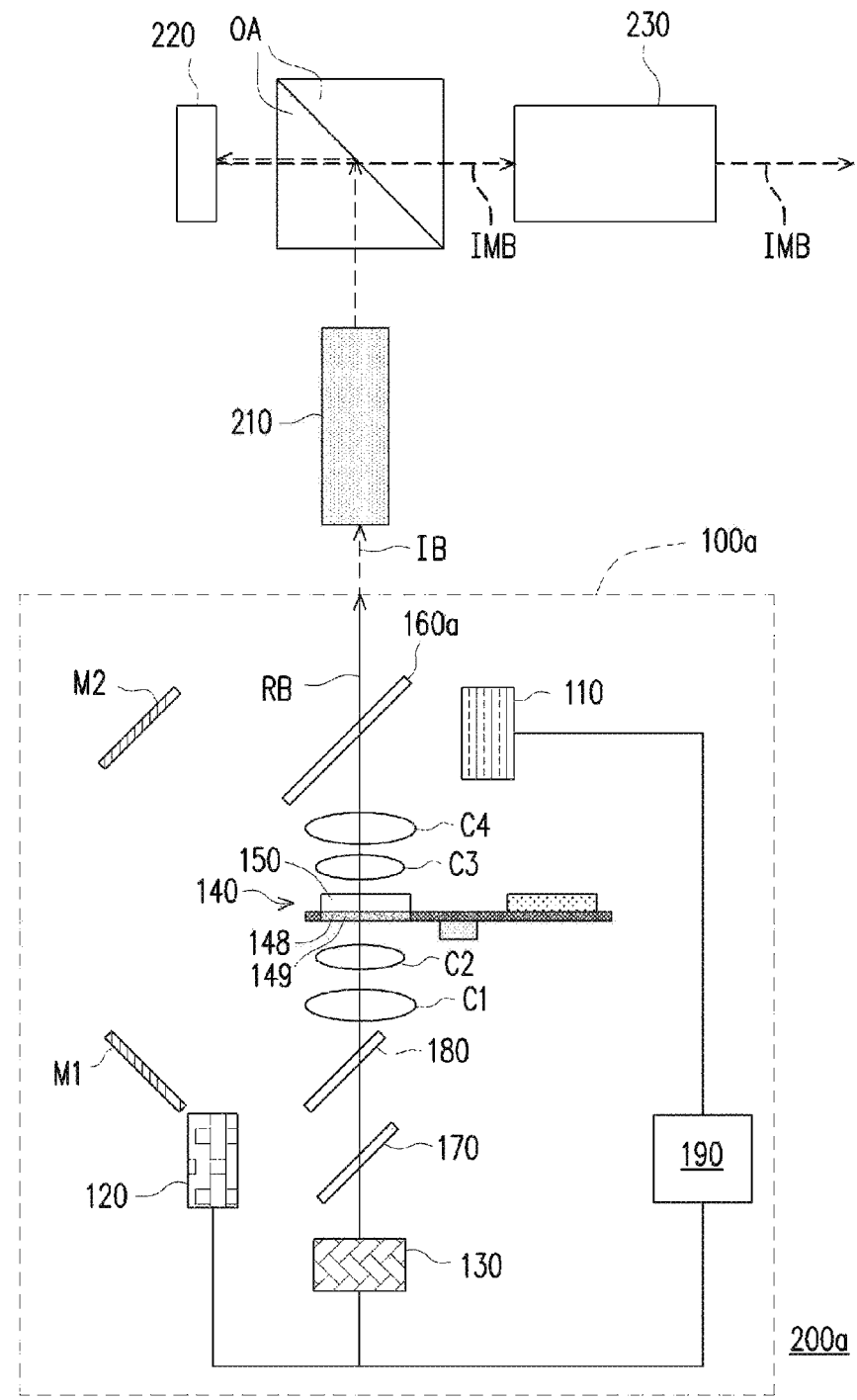
FIG. 4A to FIG. 4C are schematic diagrams of light paths of a projection device in first to third sub time intervals in a first time interval according to another embodiment of the invention.
Figure 4B:
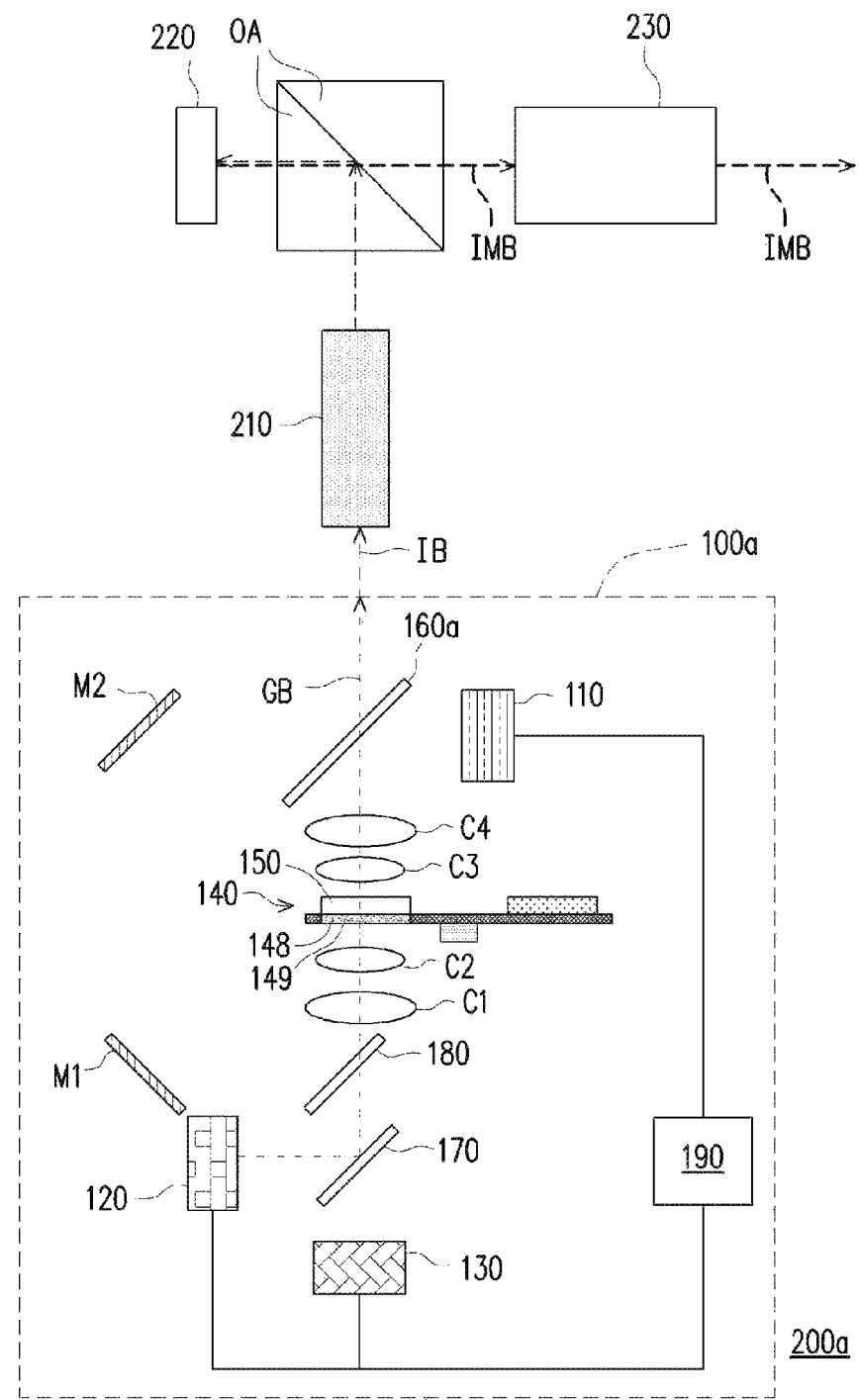
Figure 4C:
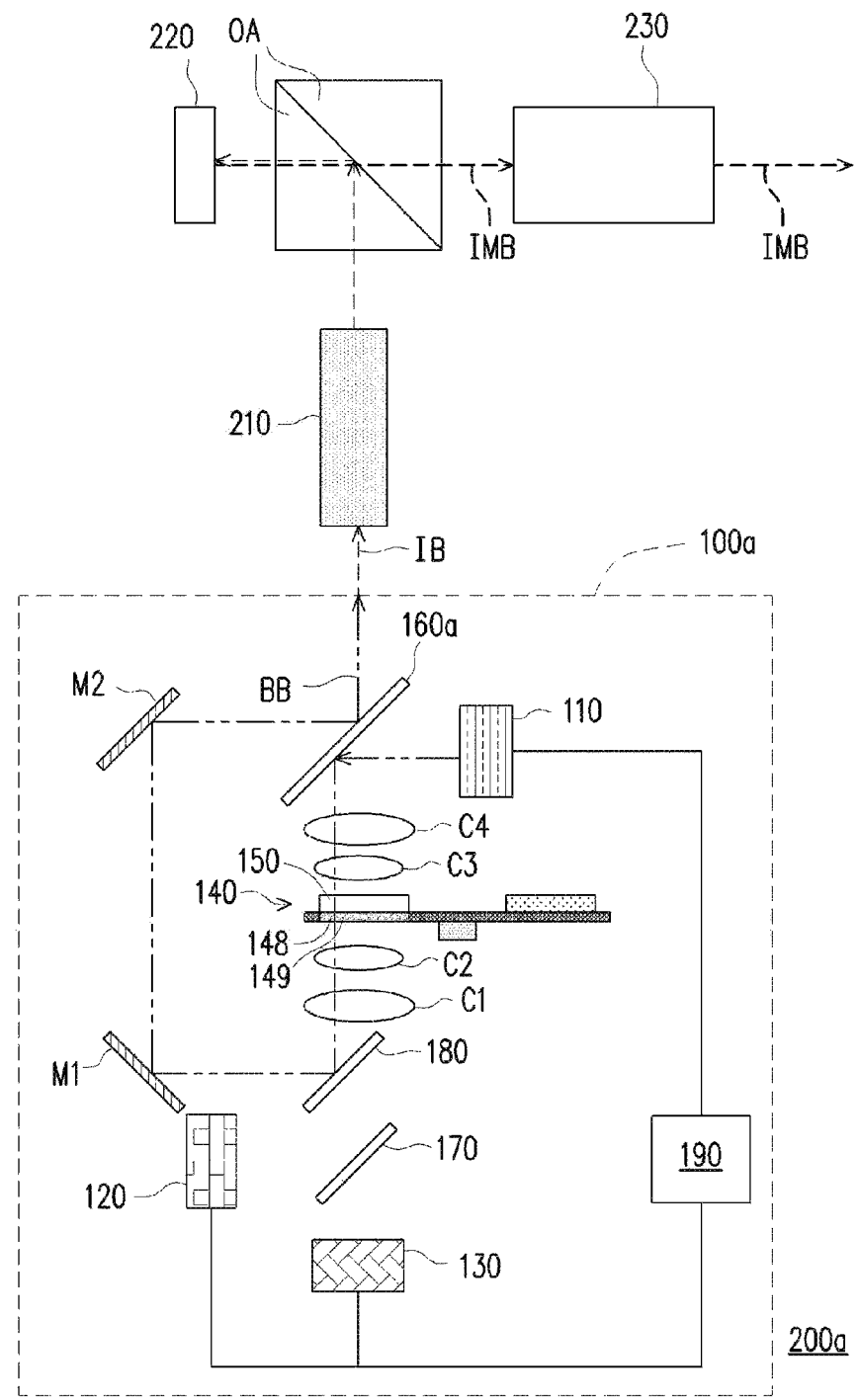
Figure 4D:
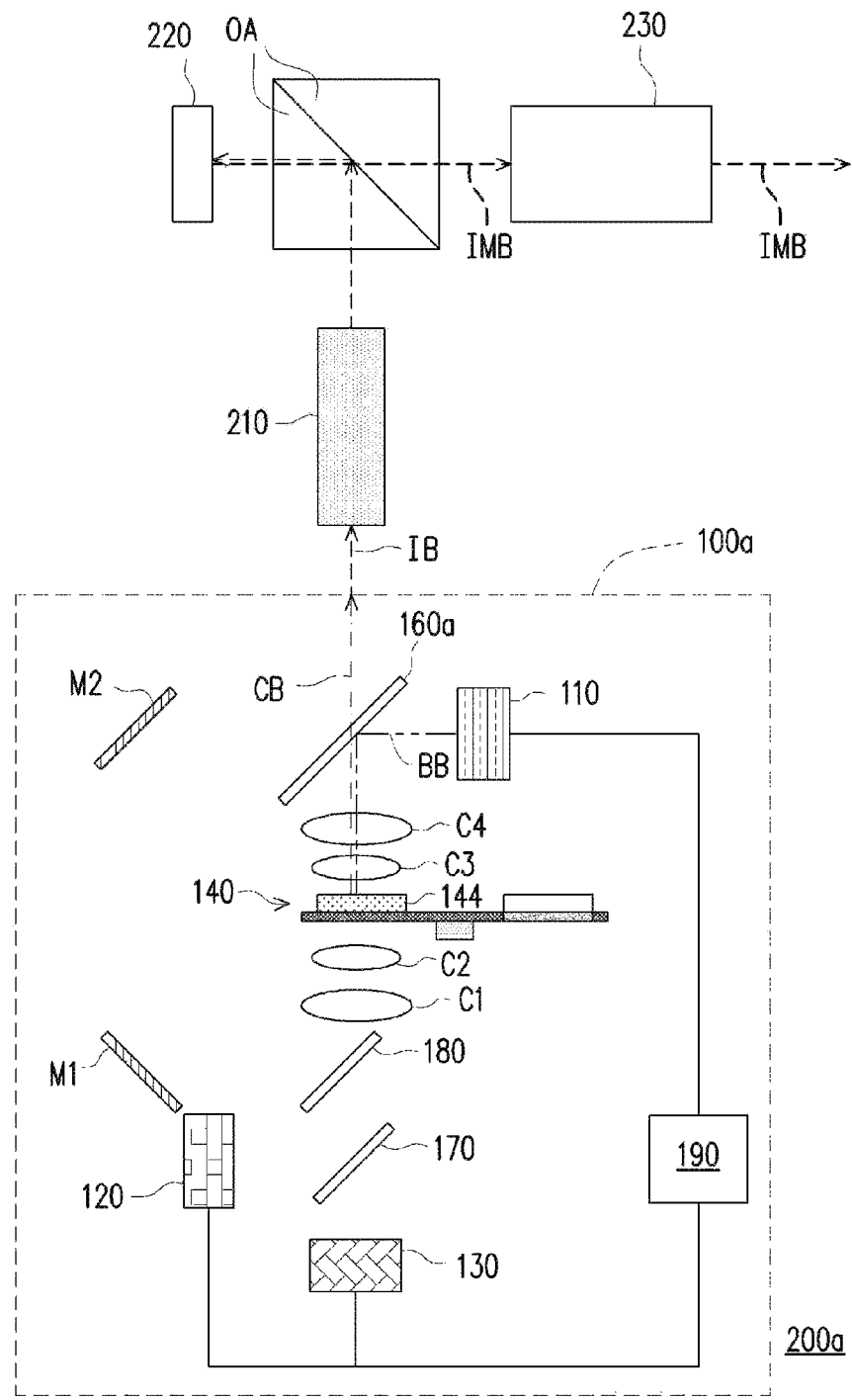
FIG. 4D is a schematic diagram of a light path of the projection device in FIG. 4A to FIG. 4C in a second time interval.

FIG. 4A to FIG. 4C are schematic diagrams of light paths of a projection device in first to third sub time intervals in a first time interval according to another embodiment of the invention. FIG. 4D is a schematic diagram of a light path of the projection device in FIG. 4A to FIG. 4C in a second time interval.

Referring to FIG. 4A to FIG. 4D, a projection device 200a and an illumination system 100a in FIG. 4A to FIG. 4D are substantially similar to the projection device 200 and the illumination system 100 in FIG. 1A to FIG. 1D, which mainly differ as follows: components are placed at different positions, and light splitting components have slightly different beam reflection (or transmission) capabilities. Specifically, the light homogenizing component 210 is disposed opposite to the red laser module 130, and the green laser module 120 and the blue laser module 110 are respectively disposed on two sides (left and right sides) of the red laser module 130. A first light splitting component 160a is designed to be capable of reflecting blue light and transmitting light in other colors.

An optical behavior difference between the projection device 200a and the projection device 200 is described below with reference to FIG. 4A to FIG. 4D. It should be noted that, only the optical behavior difference is described below, and for actions of other components, reference may be made to FIG. 1A to FIG. 1D.

Referring to FIG. 4A and FIG. 3, in the first sub time interval ST1, after the red beam RB is emitted, the red beam RB is sequentially transmitted through the second light splitting component 170, the third light splitting component 180, the lenses C1 and C2, the light transmission component 148 (scattered by the optical adjustment structure 149 in the light transmission component 148), the ½-wavelength delay component 150, the lenses C3 and C4, and the first light splitting component 160a to be emitted from the illumination system 100a. The illumination beam IB emitted by the illumination system 100a in the first sub time interval ST1 includes the red beam RB.

Referring to FIG. 4B and FIG. 3, in the second sub time interval ST2, after the green beam GB is emitted, the green beam GB is reflected by the second light splitting component 170 to the third light splitting component 180, and then sequentially transmitted through the third light splitting component 180, the lenses C1 and C2, the light transmission component 148 (scattered by the optical adjustment structure 149 in the light transmission component 148), the ½-wavelength delay component 150, the lenses C3 and C4, and the first light splitting component 160a to be emitted from the illumination system 100a. The illumination beam IB emitted by the illumination system 100a in the second sub time interval ST2 includes the green beam GB.

Referring to FIG. 4C and FIG. 3, in the third sub time interval ST3, after the blue beam BB is emitted, the blue beam BB enters the first light splitting component 160a in an incident direction and is reflected by the first light splitting component 160a, sequentially transmitted through the lenses C4 and C3, the ½-wavelength delay component 150, the light transmission component 148 (scattered by the optical adjustment structure 149 in the light transmission component 148), and the lenses C2 and C1, reflected by the third light splitting component 180, then sequentially reflected by the mirrors M1 and M2 and transmitted to the first light splitting component 160a in a direction different from the incident direction, and reflected by the first light splitting component 160a, to be emitted from the illumination system 100a. The illumination beam IB emitted by the illumination system 100a in the third sub time interval ST3 includes the blue beam BB.

Referring to FIG. 4D and FIG. 3, in the second time interval T2, after the blue beam BB is emitted, the blue beam BB is reflected by the first light splitting component 160a, and sequentially transmitted through the lenses C4 and C3 to the wavelength conversion material 144. As irradiated by the blue beam BB, the wavelength conversion material 144 emits a converted beam CB. The converted beam CB is further transmitted through the first light splitting component 160a to be emitted from the illumination system 100a. The illumination beam IB emitted by the illumination system 100a in the second time interval T2 includes the converted beam CB.

A description of a light path after the illumination beam IB in FIG. 4A to FIG. 4D is emitted from the illumination system 100a is the same as that of the projection device 200 in FIG. 1A to FIG. 1D. Descriptions thereof are omitted herein.

Figure 5A:
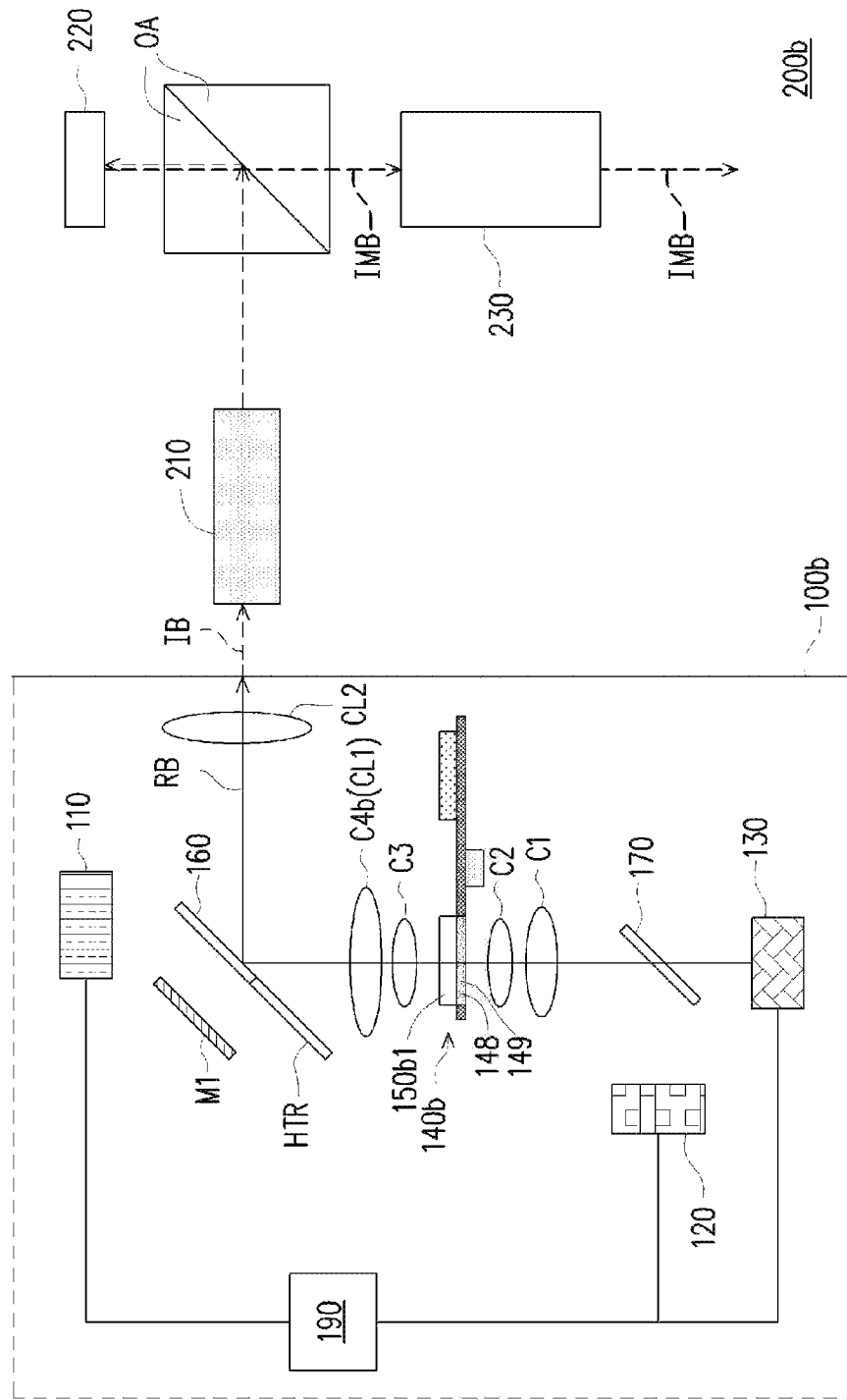
FIG. 5A to FIG. 5C are schematic diagrams of light paths of a projection device in first to third sub time intervals in a first time interval according to still another embodiment of the invention.
Figure 5B:
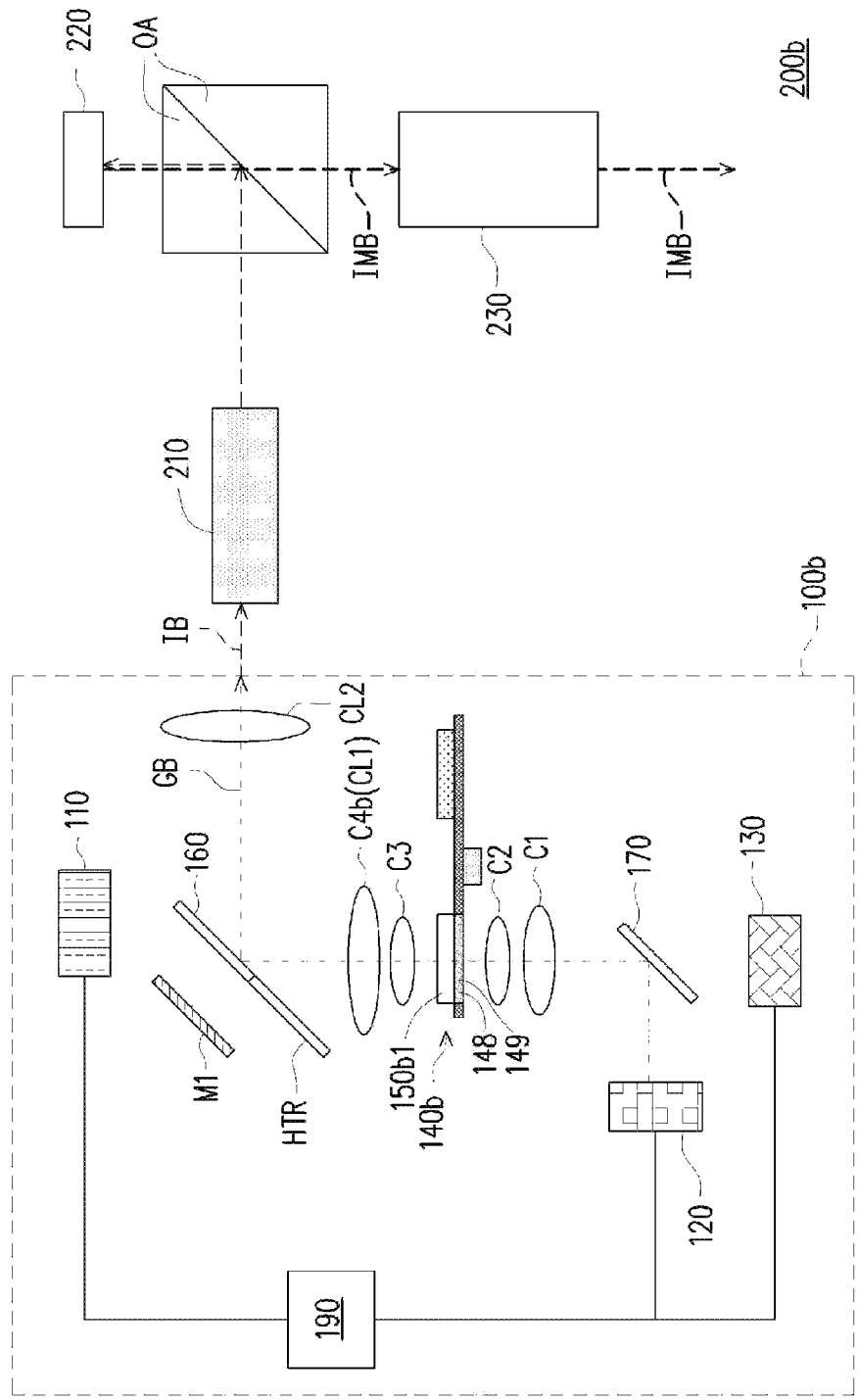
Figure 5C:
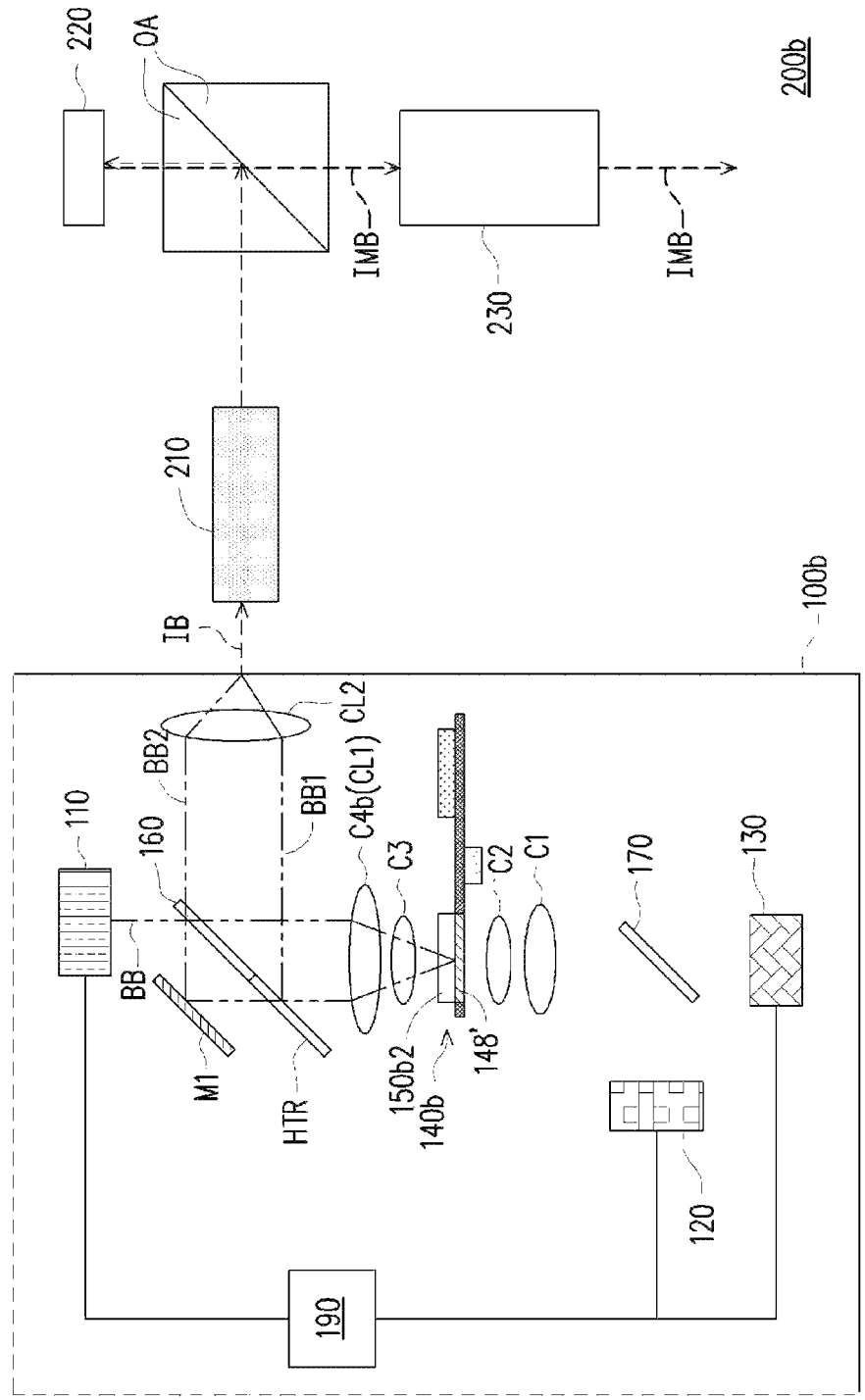
Figure 5D:
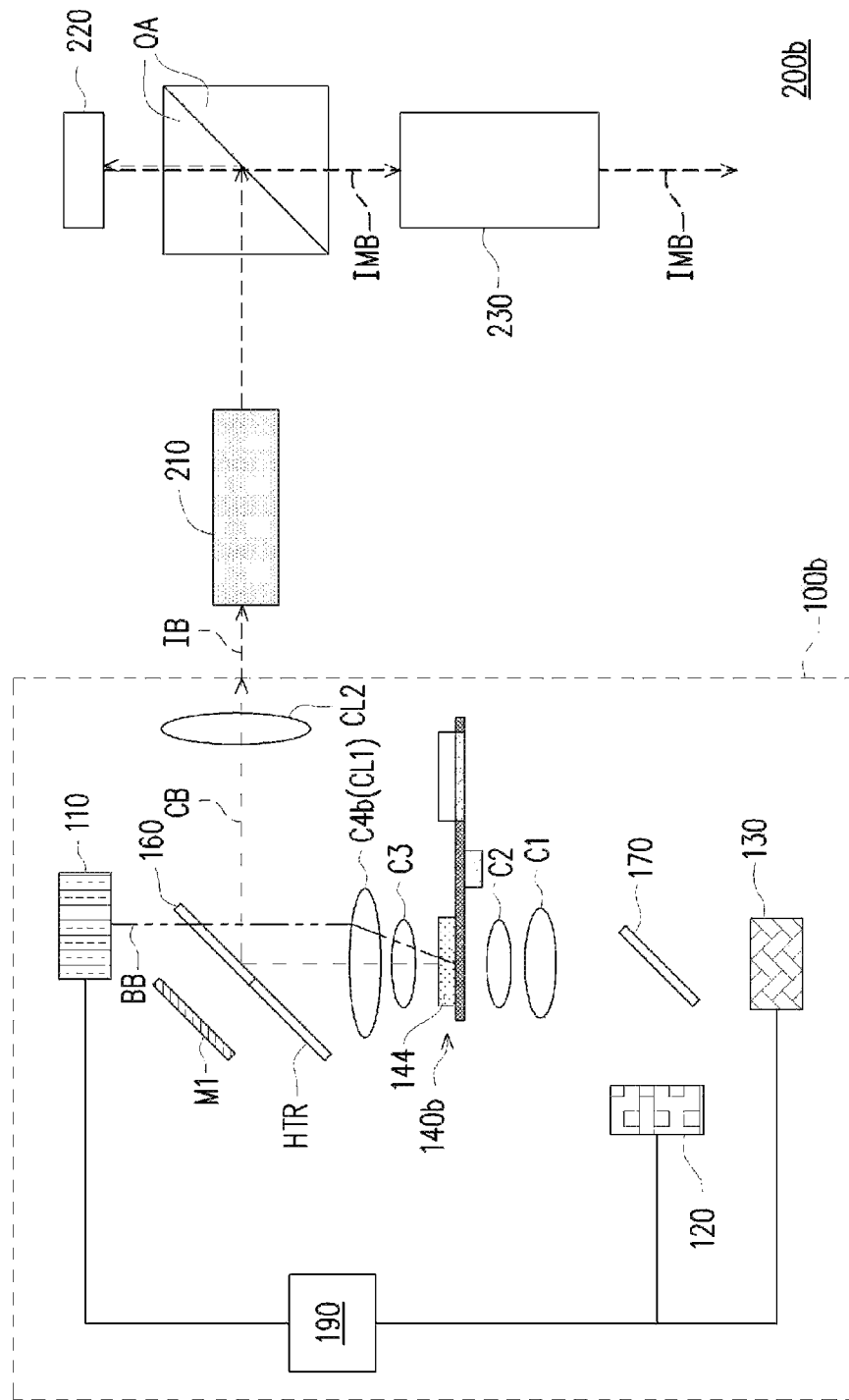
FIG. 5D is a schematic diagram of a light path of the projection device in FIG. 5A to FIG. 5C in a second time interval.
Figure 6A:
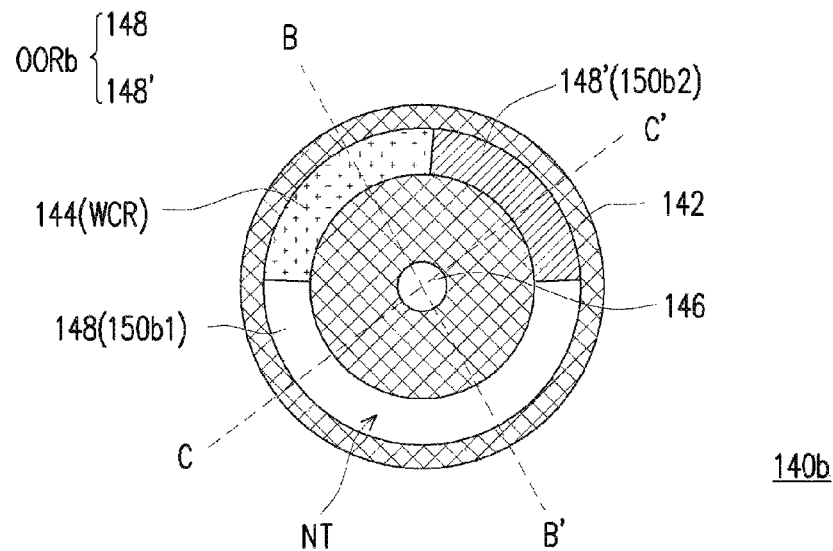
FIG. 6A is a schematic top view of a wavelength conversion component of the projection device in FIG. 5A to FIG. 5D.
Figure 6B:
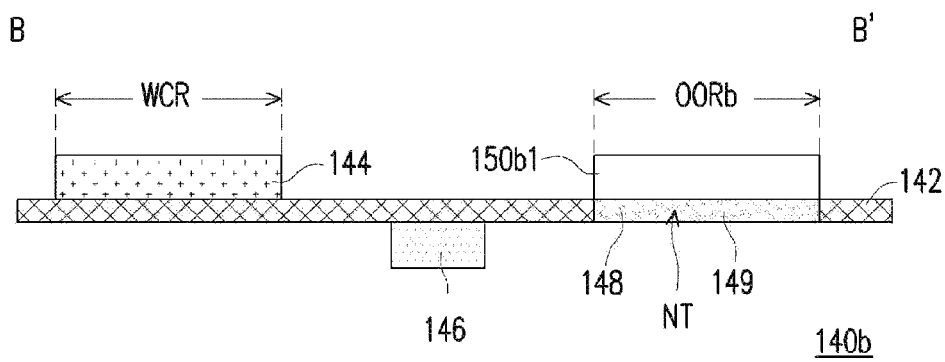
FIG. 6B is a schematic diagram of a cross section along a line B-B' in FIG. 6A.
Figure 6C:
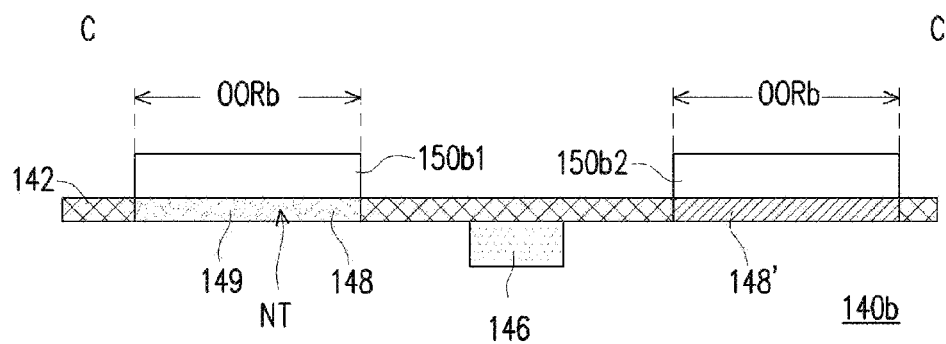
FIG. 6C is a schematic diagram of a cross section along a line C-C' in FIG. 6A.

FIG. 5A to FIG. 5C are schematic diagrams of light paths of a projection device in first to third sub time intervals in a first time interval according to still another embodiment of the invention. FIG. 5D is a schematic diagram of a light path of the projection device in FIG. 5A to FIG. 5C in a second time interval. FIG. 6A is a schematic top view of a wavelength conversion component of the projection device in FIG. 5A to FIG. 5D. FIG. 6B is a schematic diagram of a cross section along a line B-B' in FIG. 6A. FIG. 6C is a schematic diagram of a cross section along a line C-C' in FIG. 6A.

Referring to FIG. 5A to FIG. 5D, FIG. 6A, FIG. 6B, and FIG. 6C, a projection device 200b and an illumination system 100b in FIG. 5A to FIG. 5D are substantially similar to the projection device 200 and the illumination system 100 in FIG. 1A to FIG. 1D, which mainly differ as follows: a form of a wavelength conversion component 140b used in the projection device 200b and the illumination system 100b in the embodiment is, for example, a reflective phosphor wheel. Moreover, a lens C4b is a converging lens CL1. The illumination system 100b further includes a half transmission/reflection component HTR, a ¼-wavelength delay component 150b2, and another converging lens CL2. The half transmission/reflection component HTR is disposed between the blue laser module 110 and the wavelength conversion component 140b, which is an optical component that allows the blue beam transmitted to the half transmission/reflection component HTR to be partially reflected and partially transmitted. In addition, a principle of optical behavior of the ¼-wavelength delay component 150b2 is similar to a ½-wavelength delay component 150b1, which differ as follows: the ¼-wavelength delay component 150b2 enables beams in different polarization directions and passing through the wavelength delay component 150b2 to have a ¼ phase difference. Moreover, the illumination system 100b in the embodiment uses one mirror M1.

Specifically, as shown in FIG. 6A, FIG. 6B, and FIG. 6C, different from the wavelength conversion component 140, a wavelength conversion component 140b further includes a reflection component 148'. The reflection component 148' and the light transmission component 148 are both embedded in the notch NT. The ½-wavelength delay component 150b1 is disposed on a surface of the light transmission component 148, and the ¼-wavelength delay component 150b2 is disposed on a surface of the reflection component 148'. When the wavelength conversion material 144 is irradiated by a short-wavelength beam, photoluminescence occurs so that a long-wavelength beam is produced (wavelength conversion). An area defined by the wavelength conversion material 144 is also referred to as a wavelength conversion region WCR. An area defined by the light transmission component 148 allows a beam to be transmitted and emitted from the wavelength conversion component 140b (this area is also referred to as a light transmission region). Moreover, an area defined by the reflection component 148' allows a beam to be reflected and emitted from the wavelength conversion component 140b (this area is also referred to as a light reflection region). Therefore, an area defined by the light transmission component 148 and the reflection component 148' is also referred to as an optical output region OORb. That is, the optical output region OORb includes the light transmission region and light reflection region. The ½-wavelength delay component 150b1 and the ¼-wavelength delay component 150b2 are correspondingly disposed in the optical output region OORb. In addition, in other embodiments not shown, the rotating disk 142 may extend to the light reflection region, and the reflection component 148' may be a reflective coating or a reflective film disposed on the rotating disk 142, provided that a beam reflection effect can be achieved. The half transmission/reflection component HTR is connected to an end of the first light splitting component 160. The converging lens CL1 is located between the wavelength conversion component 140b and a component formed after the half transmission/reflection component HTR is connected to the first light splitting component 160. The mirror M1 is disposed downstream on a light path of the half transmission/reflection component HTR. Because light is transmitted from upstream to downstream on a light path, downstream on a light path of a component may be understood as a light path part after light passes through the component. The converging lens CL2 is disposed close to a light outlet of the illumination system 100b. In the embodiment, the optical adjustment structure 149 is preferably disposed only on the light transmission component 148 and not disposed on the reflection component 148'. Certainly, in other embodiments, the optical adjustment structure 149 may be disposed on the reflection component 148'. However, when the optical adjustment structure 149 includes a structure that can scatter a beam, a beam entering the reflection component 148' may be excessively scattered due to impact of the optical adjustment structure 149, and cannot be successfully enter the half transmission/reflection component HTR. Therefore, in this case, it is necessary to consider that the optical adjustment structure 149 disposed on the reflection component 148' should not excessively scatter the beam. For example, the optical adjustment structure 149 should not cause excessive haze, to avoid an excessive deviation between a subsequent light path and a preset light path and impact on an overall optical effect.

Figure 7:
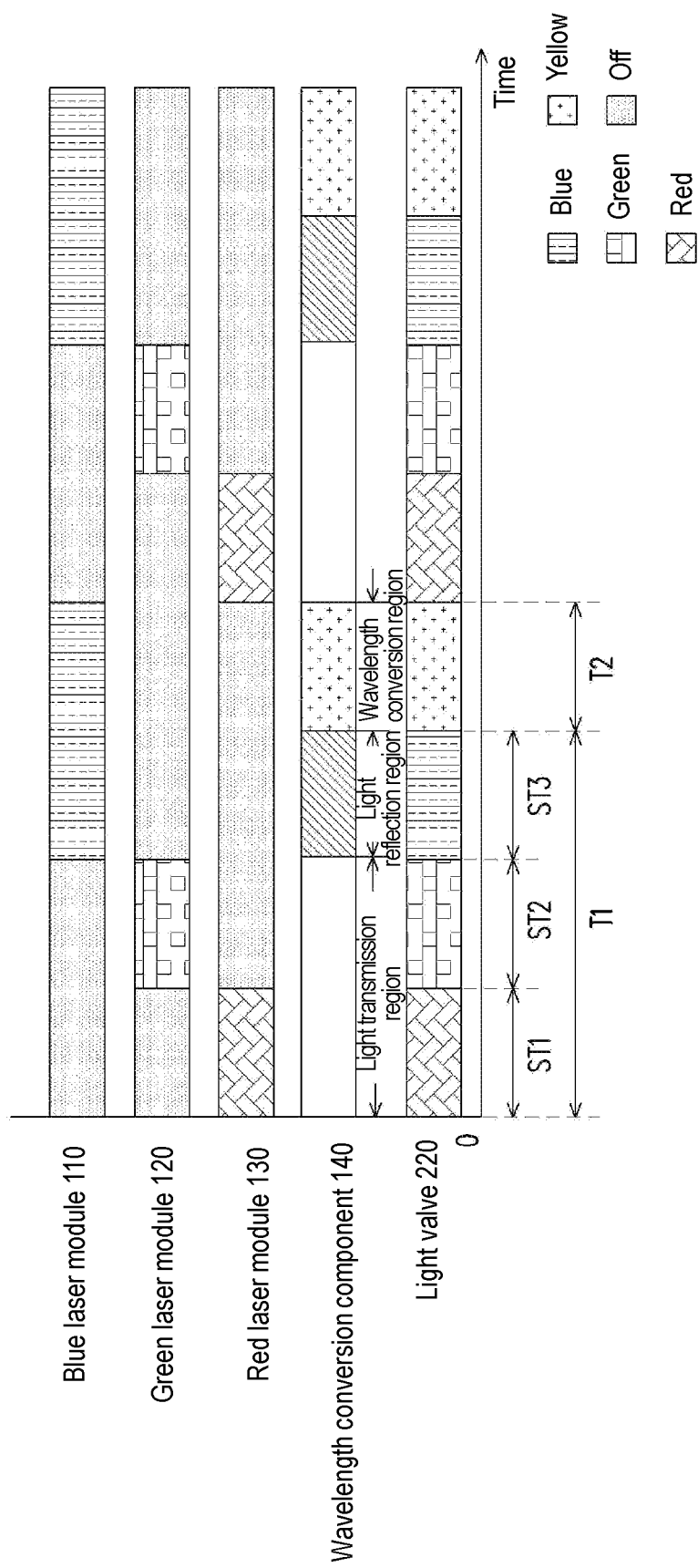
FIG. 7 is a timing diagram of different components in a projection device according to a plurality of embodiments of the invention.

FIG. 7 is a timing diagram of different components in a projection device according to a plurality of embodiments of the invention. A unit of a horizontal axis in FIG. 7 is time.

Optical behavior and component action differences between the projection device 200b and the projection device 200 are described below with reference to FIG. 5A to FIG. 5D and FIG. 7.

Referring to FIG. 5A, FIG. 6A, and FIG. 7, in the first sub time interval ST1, the rotating shaft 146 of the wavelength conversion component 140b rotates to put the light transmission component 148 on the light path of the red beam RB. After the red beam RB is emitted, the red beam RB is sequentially transmitted through the second light splitting component 170, the lenses C1 and C2, the light transmission component 148 (scattered by the optical adjustment structure 149 in the light transmission component 148), the ½-wavelength delay component 150b1, the lens C3, and the converging lens CL1, reflected by the first light splitting component 160, transmitted through the converging lens CL2, and then emitted from the illumination system 100b. The illumination beam IB emitted by the illumination system 100b in the first sub time interval ST1 includes the red beam RB.

Referring to FIG. 5B, FIG. 6A, and FIG. 7, in the second sub time interval ST2, the rotating shaft 146 of the wavelength conversion component 140b rotates to put the light transmission component 148 on the light path of the green beam GB. After the green beam GB is emitted, the green beam GB is reflected by the second light splitting component 170, sequentially transmitted through the lenses C1 and C2, the light transmission component 148 (scattered by the optical adjustment structure 149 in the light transmission component 148), the ½-wavelength delay component 150b1, the lens C3, and the converging lens CL1, reflected by the first light splitting component 160, transmitted through the converging lens CL2, and then emitted from the illumination system 100b. The illumination beam IB emitted by the illumination system 100b in the second sub time interval ST2 includes the green beam GB.

Referring to FIG. 5C, FIG. 6A, and FIG. 7, in the third sub time interval ST3, the rotating shaft 146 of the wavelength conversion component 140b rotates to put the reflection component 148' on the light path of the blue beam BB. After the blue beam BB is emitted, the blue beam BB is transmitted through the first light splitting component 160, enters the converging lens CL1 from one side of the converging lens CL1, transmitted through the lens C3 and the ¼-wavelength delay component 150b2 to the reflection component 148' of the wavelength conversion component 140b, and reflected by the reflection component 148'. The reflected blue beam BB is then transmitted through the lens C3, and enters the converging lens CL1 from the other side of the converging lens CL1, to be emitted from the converging lens CL1 and transmitted to the half transmission/reflection component HTR. A part BB1 of the blue beam is reflected by the half transmission/reflection component HTR. In addition, a part BB2 of the blue beam is transmitted through the half transmission/reflection component HTR and then reflected by the mirror M1, and then transmitted through the first light splitting component 160. Energy of the blue beams BB1 and BB2 is roughly the same, and light paths of the blue beam BB1 reflected by the half transmission/reflection component HTR and the blue beam BB2 reflected by the mirror M1 and then transmitted through the first light splitting component 160 are roughly symmetric relative to an optical axis of the converging lens CL2, so that an image provided by the projection device 200b has desirable color uniformity. The blue beams BB1 and BB2 are then converged by the converging lens CL2 to be emitted from the illumination system 100b. The illumination beam IB emitted by the illumination system 100b in the third sub time interval ST3 includes the blue beam BB.

Referring to FIG. 5D, FIG. 6A, and FIG. 7, in the second time interval T2, the rotating shaft 146 of the wavelength conversion component 140b rotates to put the wavelength conversion material 144 on the light path of the blue beam BB. After the blue beam BB is emitted, the blue beam BB is transmitted through the first light splitting component 160, enters the converging lens CL1 from one side of the converging lens CL1, and transmitted through the lens C3 to the wavelength conversion material 144 of the wavelength conversion component 140b. As irradiated by the blue beam BB, the wavelength conversion material 144 emits a converted beam CB. The converted beam CB is, for example, a yellow beam. The converted beam CB is transmitted to the first light splitting component 160 and then reflected by the first light splitting component 160, transmitted through the converging lens CL2, and then emitted from the illumination system 100b. The illumination beam IB emitted by the illumination system 100b in the second time interval T2 includes the converted beam CB.

Referring to FIG. 5A to FIG. 5C, FIG. 6A, FIG. 6B, and FIG. 6C again, because the blue, red, and green beams BB, RB, and GB all pass through the optical output region OORb defined by the light transmission component 148 and the reflection component 148', and the optical output region OORb is provided with the ½-wavelength delay component 150b1 and the ¼-wavelength delay component 150b2, so that a phase of the blue beam BB passing through the optical output region OORb may be delayed by a ¼ phase difference, and phases of the red beam RB and the green beam GB passing through the optical output region OORb may be delayed by a ½ phase difference, a problem that a picture has an abnormal color is eliminated.

A description of a light path after the illumination beam IB in FIG. 5A to FIG. 5D is emitted from the illumination system 100b is the same as that of the projection device 200 in FIG. 1A to FIG. 1D. Descriptions thereof are omitted herein.

Figure 8A:
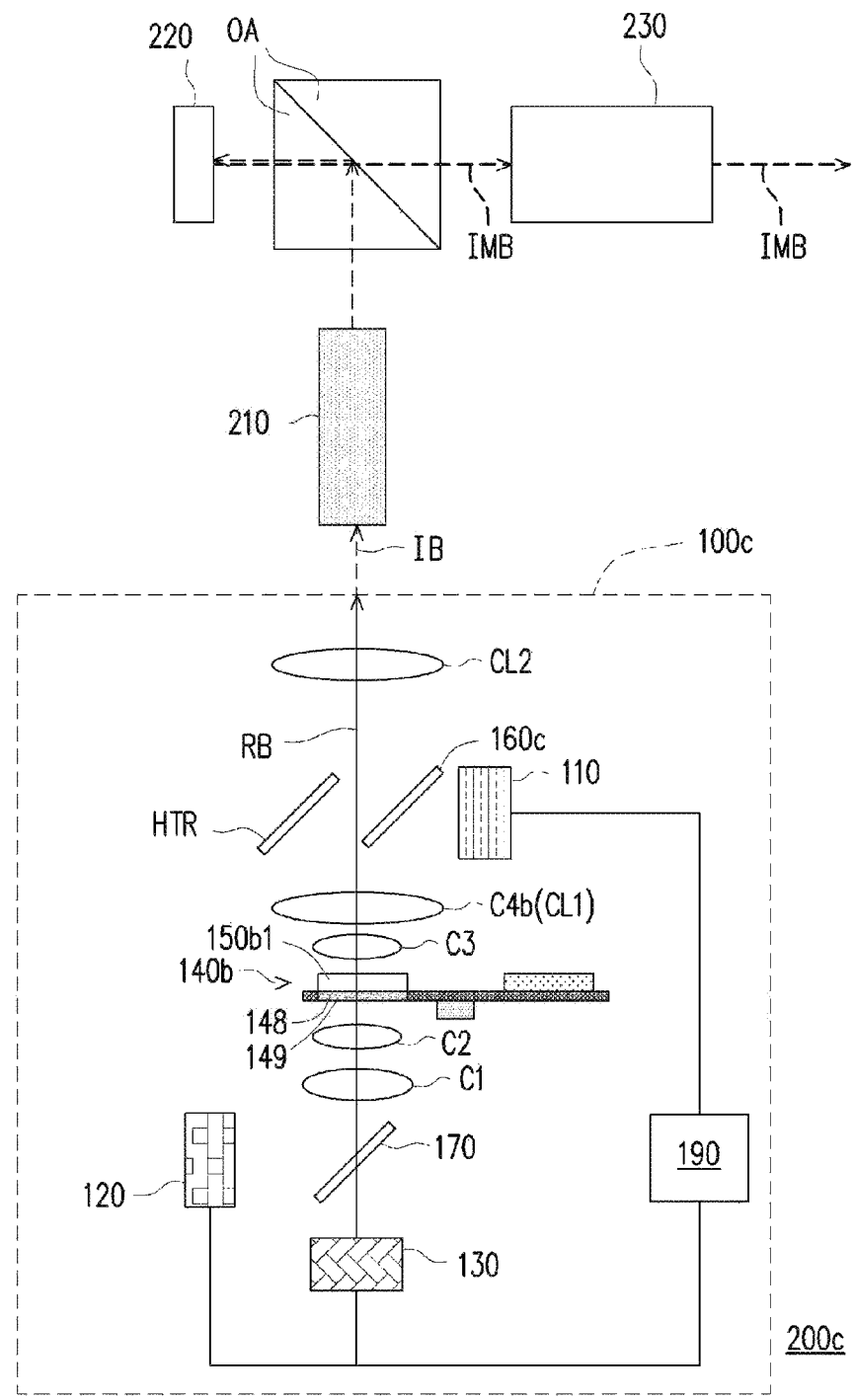
FIG. 8A to FIG. 8C are schematic diagrams of light paths of a projection device in first to third sub time intervals in a first time interval according to yet another embodiment of the invention.
Figure 8B:
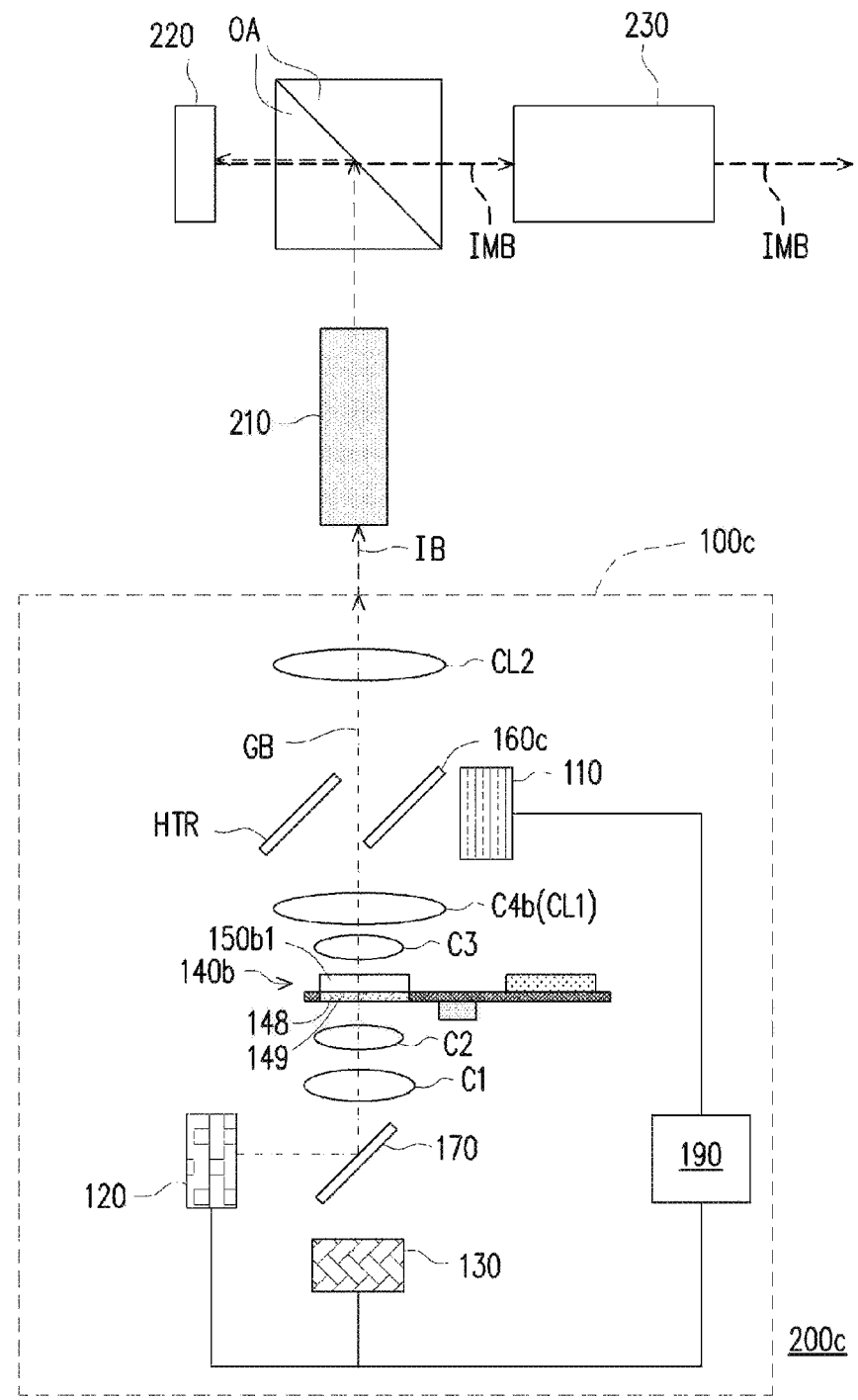
Figure 8C:
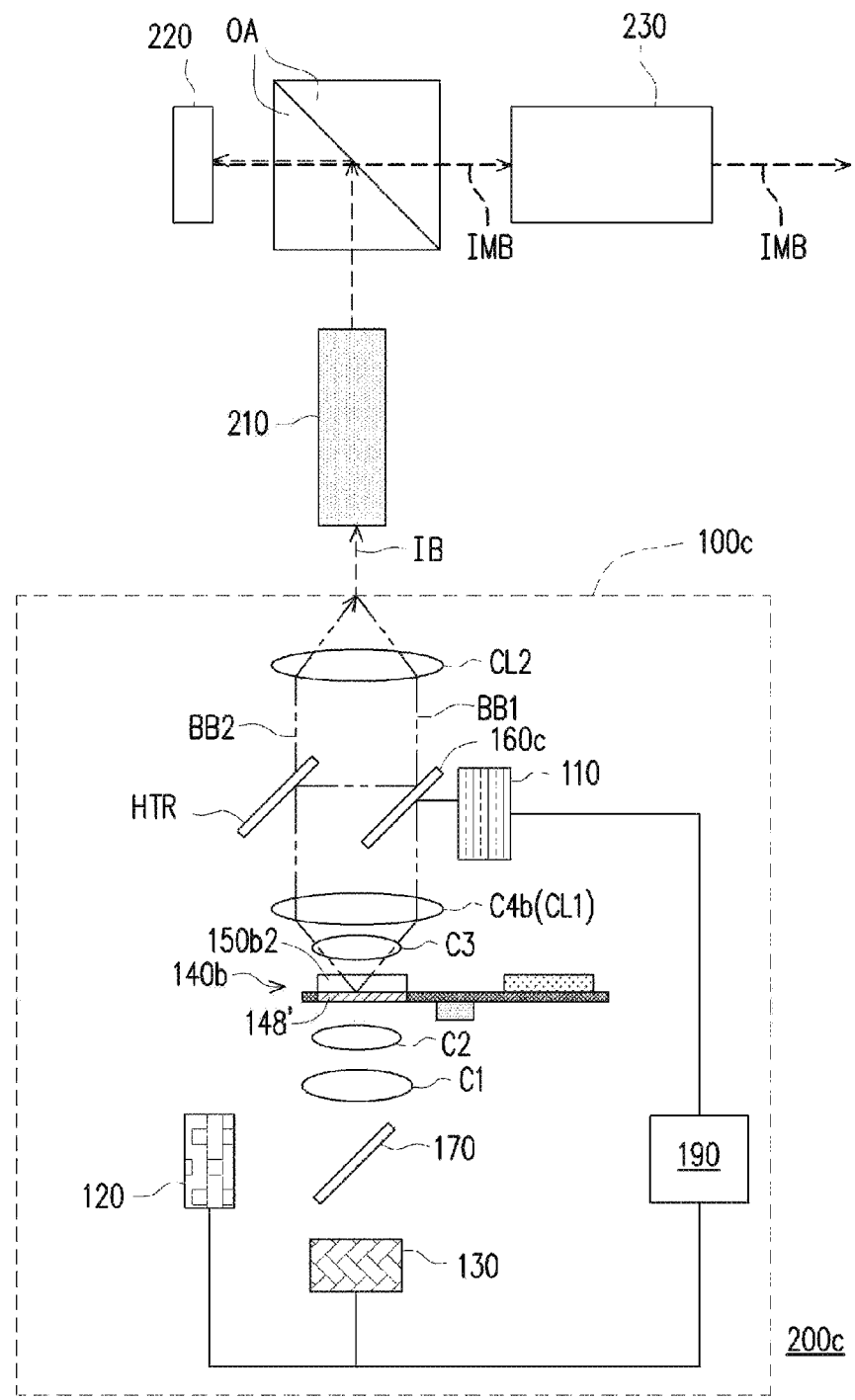
Figure 8D:
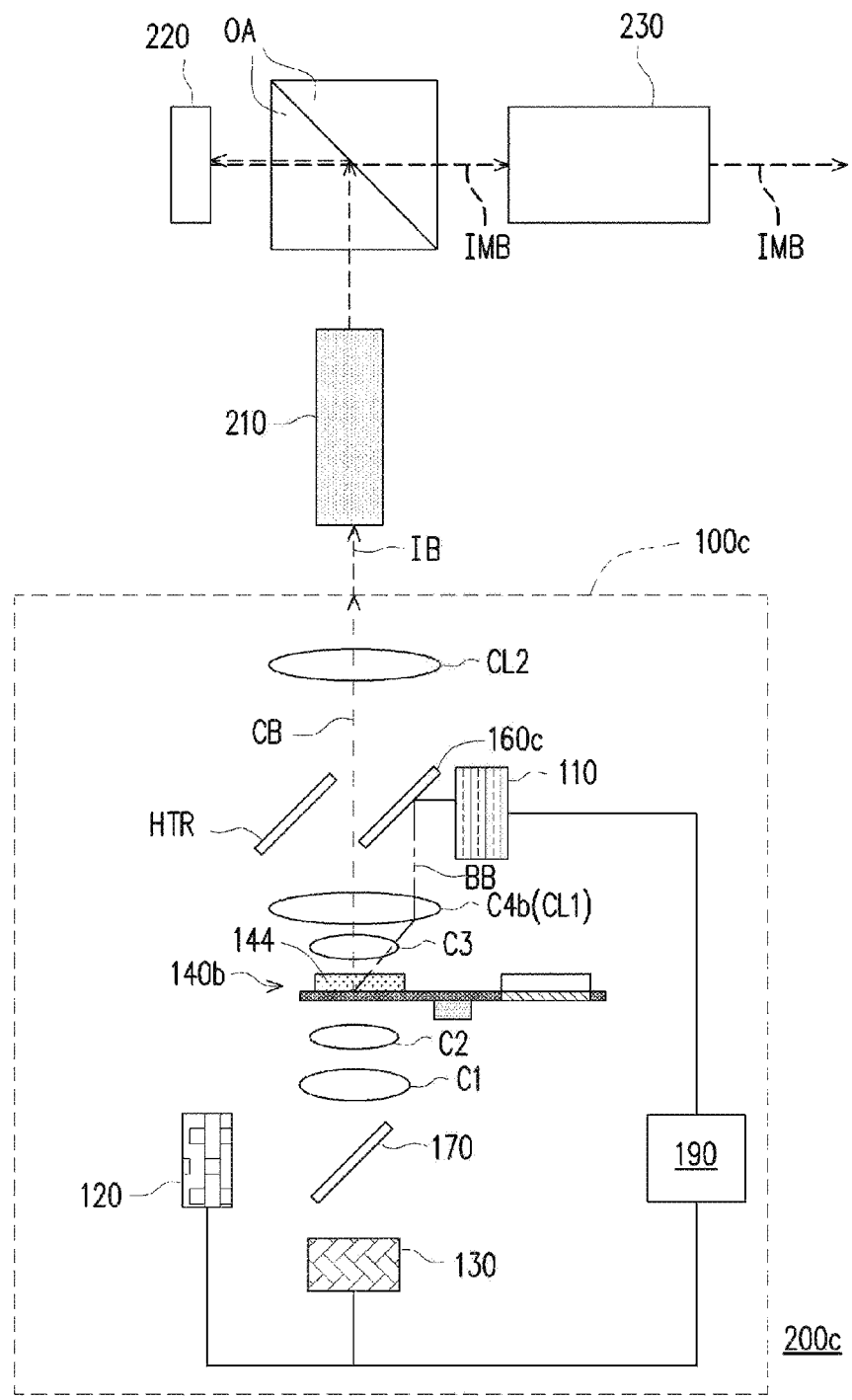
FIG. 8D is a schematic diagram of a light path of the projection device in FIG. 8A to FIG. 8C in a second time interval.

FIG. 8A to FIG. 8C are schematic diagrams of light paths of a projection device in first to third sub time intervals in a first time interval according to yet another embodiment of the invention. FIG. 8D is a schematic diagram of a light path of the projection device in FIG. 8A to FIG. 8C in a second time interval.

Referring to FIG. 8A to FIG. 8D, a projection device 200c and an illumination system 100c in FIG. 8A to FIG. 8D are substantially similar to the projection device 200b and the illumination system 100b in FIG. 5A to FIG. 5D, which mainly differ as follows: components are placed at different positions, and light splitting components have slightly different beam reflection (or transmission) capabilities. Specifically, in the projection device 200c and the illumination system 100c in the embodiment, the light homogenizing component 210 is disposed opposite to the red laser module 130, and the green laser module 120 and the blue laser module 110 are respectively disposed on two sides of the red laser module 130. A first light splitting component 160c is designed to be capable of reflecting blue light and transmitting light in other colors. Moreover, the first light splitting component 160c is separated from the half transmission/reflection component HTR, which are disposed parallel to each other. The converging lens CL1 is located between the half transmission/reflection component HTR, the first light splitting component 160c, and the wavelength conversion component 140b.

An optical behavior difference between the projection device 200c and the projection device 200b is described below with reference to FIG. 8A to FIG. 8D, FIG. 6A, and FIG. 7.

Referring to FIG. 8A, FIG. 6A, and FIG. 7, in the first sub time interval ST1, the rotating shaft 146 of the wavelength conversion component 140b rotates to put the light transmission component 148 on the light path of the red beam RB. After the red beam RB is emitted, the red beam RB is sequentially transmitted through the second light splitting component 170, the lenses C1 and C2, the light transmission component 148 (scattered by the optical adjustment structure 149 in the light transmission component 148), the ½-wavelength delay component 150, the lens C3, and the converging lenses CL1 and CL2 to be emitted from the illumination system 100c. In some embodiments, depending on an angle at which the half transmission/reflection component HTR and the first light splitting component 160c are placed, after being emitted from the converging lens CL1, the red beam RB may be transmitted to the converging lens CL2 through the half transmission/reflection component HTR and/or the first light splitting component 160c. The illumination beam IB emitted by the illumination system 100c in the first sub time interval ST1 includes the red beam RB.

Referring to FIG. 8B, FIG. 6A, and FIG. 7, in the second sub time interval ST2, the rotating shaft 146 of the wavelength conversion component 140b rotates to put the light transmission component 148 on the light path of the green beam GB. After the green beam GB is emitted, the green beam GB is reflected by the second light splitting component 170, and sequentially transmitted through the lenses C1 and C2, the light transmission component 148 (scattered by the optical adjustment structure 149 in the light transmission component 148), the ½-wavelength delay component 150, the lens C3, and the converging lenses CL1 and CL2 to be emitted from the illumination system 100c. In some embodiments, depending on an angle at which the half transmission/reflection component HTR and the first light splitting component 160c are placed, after being emitted from the converging lens CL1, the green beam GB may be transmitted to the converging lens CL2 through the half transmission/reflection component HTR and/or the first light splitting component 160c. The illumination beam IB emitted by the illumination system 100c in the second sub time interval ST2 includes the green beam GB.

Referring to FIG. 8C, FIG. 6A, and FIG. 7, in the third sub time interval ST3, the rotating shaft 146 of the wavelength conversion component 140b rotates to put the reflection component 148' on the light path of the blue beam BB. After the blue beam BB is emitted, the blue beam BB is reflected by the first light splitting component 160c, enters the converging lens CL1 from one side of the converging lens CL1, transmitted through the lens C3 to the reflection component 148' of the wavelength conversion component 140b, and reflected by the reflection component 148'. The reflected blue beam BB is then transmitted through the lens C3, and enters the converging lens CL1 from the other side of the converging lens CL1, to be emitted from the converging lens CL1 and transmitted to the half transmission/reflection component HTR. In this case, a part BB1 of the blue beam is reflected by the half transmission/reflection component HTR to the first light splitting component 160c, and reflected by the first light splitting component 160c to one side of the converging lens CL2. In addition, a part BB2 of the blue beam is transmitted through the half transmission/reflection component HTR to the other side of the converging lens CL2. Energy of the blue beams BB1 and BB2 is roughly the same, and light paths of the blue beam BB1 reflected by the first light splitting component 160c and the blue beam BB2 transmitted through the half transmission/reflection component HTR are roughly symmetric relative to an optical axis of the converging lens CL2, so that an image provided by the projection device 200c has desirable color uniformity. The blue beams BB1 and BB2 are converged by the converging lens CL2, and then emitted from the illumination system 100c. The illumination beam IB emitted by the illumination system 100c in the third sub time interval ST3 includes the blue beams BB1 and BB2.

Referring to FIG. 8D, FIG. 6A, and FIG. 7, in the second time interval T2, the rotating shaft 146 of the wavelength conversion component 140b rotates to put the wavelength conversion material 144 on the light path of the blue beam BB. After the blue beam BB is emitted, the blue beam BB is reflected by the first light splitting component 160c, enters the converging lens CL1 from one side of the converging lens CL1, and transmitted through the lens C3 to the wavelength conversion material 144 of the wavelength conversion component 140b. As irradiated by the blue beam BB, the wavelength conversion material 144 emits a converted beam CB. The converted beam CB is, for example, a yellow beam. The converted beam CB is transmitted through the converging lens CL2 to be emitted from the illumination system 100c. The illumination beam IB emitted by the illumination system 100b in the second time interval T2 includes the converted beam CB.

A description of a light path after the illumination beam IB in FIG. 8A to FIG. 8D is emitted from the illumination system 100c is the same as that of the projection device 200 in FIG. 1A to FIG. 1D. Descriptions thereof are omitted herein.

It should be noted that, in the foregoing embodiments, configuration of the first, second, and third light splitting components and their corresponding colored light reflection or transmission capabilities are meant to meet the colored light timing diagram in FIG. 3 or FIG. 7 and conform to optical architecture configurations of different projection devices. A person skilled in the art may select a different quantity of light splitting components with different capabilities to reflect corresponding colored light according to the colored light timing diagram in FIG. 3 or FIG. 7 and optical architecture configurations of different projection devices. The invention is not limited thereto.

Based on the above, in the illumination system and the projection device in the embodiments of the invention, a comprehensive optical architecture including the blue, green, and red laser modules and the wavelength conversion component is used. Compared with the related art, because the invention includes more green light sources (the green laser module and the wavelength conversion component), a quantity of green light emitting components in the green laser module can be reduced in use, or light intensity of the green beam provided by the green laser module can be reduced, while an overall illumination beam provided by the illumination system can maintain same light intensity in a green light band. Therefore, the illumination system and the projection device can achieve color performance of a wide color gamut at relatively low costs. Moreover, the wavelength conversion component is disposed on the transmitting paths of the blue, green, and red beams emitted by the blue, green, and red laser modules. If to further modify the blue, green, or red beam, a user can directly integrate an optical modification function into the wavelength conversion component, to save a component in use, and further reduce system complexity and manufacturing costs.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims.

What is claimed is:

1. An illumination system, configured to provide an illumination beam, and comprising: a blue laser module, a green laser module, a red laser module, a wavelength delay component, and a wavelength conversion component, wherein
    the blue laser module is configured to provide a blue beam;
    the green laser module is configured to provide a green beam;
    the red laser module is configured to provide a red beam;
    the wavelength conversion component has a wavelength conversion region and an optical output region;
    the wavelength delay component correspondingly disposed in the optical output region,
    wherein
    in a first time interval, the blue beam, the green beam, and the red beam are sequentially transmitted to the optical output region, wherein the illumination beam comprises the blue beam, the green beam, and the red beam;
    in a second time interval, the blue beam is transmitted to the wavelength conversion region to form a converted beam, wherein the illumination beam comprises the converted beam.

2. The illumination system according to claim 1, wherein the optical output region is provided with an optical adjustment structure.

3. The illumination system according to claim 1, wherein the wavelength delay component comprises a ½-wavelength delay component correspondingly disposed in the optical output region.

4. The illumination system according to claim 1, wherein the wavelength delay component comprises a ¼-wavelength delay component correspondingly disposed in the optical output region.

5. The illumination system according to claim 1, wherein the optical output region is a light transmission region, and the blue beam, the green beam, and the red beam sequentially transmit through the light transmission region.

6. The illumination system according to claim 1, wherein the optical output region further comprises a light reflection region and a light transmission region, wherein
    the blue beam is transmitted to the light reflection region to be reflected by the light reflection region;
    the green beam and the red beam are sequentially transmitted to the light transmission region to transmit through the light transmission region.

7. The illumination system according to claim 6, further comprising a converging lens, wherein
    the blue beam enters the converging lens from one side of the converging lens, and transmitted to the light reflection region,
    the blue beam is reflected by the light reflection region to the other side of the converging lens to be emitted from the converging lens.

8. The illumination system according to claim 1, further comprising a first light splitting component and second light splitting component, wherein
    the first light splitting component is disposed between the blue laser module and the wavelength conversion component, and configured to guide the blue beam so that the blue beam is transmitted to the wavelength conversion component;
    the second light splitting component is disposed between the green laser module and the red laser module, and configured to guide the green beam and the red beam so that the green beam and the red beam are transmitted to the wavelength conversion component.

9. The illumination system according to claim 8, further comprising:
    a third light splitting component, disposed between the wavelength conversion component, the green laser module, and the red laser module, and configured to guide the green beam and the red beam so that the green beam and the red beam are transmitted to the wavelength conversion component.

10. An illumination system, configured to provide an illumination beam, and comprising: a blue laser module, a green laser module, a red laser module, a first light splitting component, a second light splitting component, a half transmission/reflection component and a wavelength conversion component, wherein
    the blue laser module is configured to provide a blue beam;
    the green laser module is configured to provide a green beam;
    the red laser module is configured to provide a red beam;
    the wavelength conversion component has a wavelength conversion region and an optical output region,
    the first light splitting component is disposed between the blue laser module and the wavelength conversion component, and configured to guide the blue beam so that the blue beam is transmitted to the wavelength conversion component;
    the second light splitting component is disposed between the green laser module and the red laser module, and configured to guide the green beam and the red beam so that the green beam and the red beam are transmitted to the wavelength conversion component,
    the half transmission/reflection component disposed between the blue laser module and the wavelength conversion component,
    wherein
    in a first time interval, the blue beam, the green beam, and the red beam are sequentially transmitted to the optical output region, wherein the illumination beam comprises the blue beam, the green beam, and the red beam;

in a second time interval, the blue beam is transmitted to the wavelength conversion region to form a converted beam, wherein the illumination beam comprises the converted beam.

11. The illumination system according to claim 10, wherein the first light splitting component is connected to the half transmission/reflection component.

12. The illumination system according to claim 10, wherein the first light splitting component is separated from the half transmission/reflection component.

13. A projection device, comprising: an illumination system, a light valve, and a projection lens, wherein the illumination system is configured to provide an illumination beam, and comprises: a blue laser module, a green laser module, a red laser module, a wavelength delay component, and a wavelength conversion component, wherein the blue laser module is configured to provide a blue beam;

the green laser module is configured to provide a green beam;

the red laser module is configured to provide a red beam;

the wavelength conversion component has a wavelength conversion region and an optical output region;

the wavelength delay component correspondingly disposed in the optical output region, wherein in a first time interval, the blue beam, the green beam, and the red beam are sequentially transmitted to the optical output region, wherein the illumination beam comprises the blue beam, the green beam, and the red beam;

in a second time interval, the blue beam is transmitted to the wavelength conversion region to form a converted beam, wherein the illumination beam comprises the converted beam;

the light valve is disposed on a transmitting path of the illumination beam, and converts the illumination beam into an image beam;

the projection lens is disposed on a transmitting path of the image beam.

14. The projection device according to claim 13, wherein the optical output region is provided with an optical adjustment structure.

15. The projection device according to claim 13, wherein the wavelength delay component comprises a ½-wavelength delay component correspondingly disposed in the optical output region.

16. The projection device according to claim 13, wherein the wavelength delay component comprises a ¼-wavelength delay component correspondingly disposed in the optical output region.

17. The projection device according to claim 13, wherein the optical output region is a light transmission region, and the blue beam, the green beam, and the red beam are sequentially transmitted through the light transmission region.

18. The projection device according to claim 13, wherein the optical output region further comprises a light reflection region and a light transmission region, wherein the blue beam is transmitted to the light reflection region to be reflected by the light reflection region;

the green beam and the red beam are sequentially transmitted to the light transmission region to transmit through the light transmission region.

19. The projection device according to claim 18, further comprising a converging lens, wherein the blue beam enters the converging lens from one side of the converging lens, and transmitted to the light reflection region, the blue beam is reflected by the light reflection region to the other side of the converging lens to be emitted from the converging lens.

20. The projection device according to claim 13, further comprising a first light splitting component and second light splitting component, wherein the first light splitting component is disposed between the blue laser module and the wavelength conversion component, and configured to guide the blue beam so that the blue beam is transmitted to the wavelength conversion component;

the second light splitting component is disposed between the green laser module and the red laser module, and configured to guide the green beam and the red beam so that the green beam and the red beam are transmitted to the wavelength conversion component.

* * * * *